US010536305B2

(12) United States Patent
Shelby et al.

(10) Patent No.: US 10,536,305 B2
(45) Date of Patent: *Jan. 14, 2020

(54) SCRAMBLING SEQUENCE DESIGN FOR MULTI-MODE BLOCK DISCRIMINATION ON DCI BLIND DETECTION

(71) Applicant: Coherent Logix, Incorporated, Austin, TX (US)

(72) Inventors: Kevin A. Shelby, Austin, TX (US); Feng Liu, Waterloo (CA); David R. Starks, Waterloo (CA); Mark Earnshaw, Kanata (CA)

(73) Assignee: COHERENT LOGIX, INCORPORATED, Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/055,380

(22) Filed: Aug. 6, 2018

(65) Prior Publication Data

US 2019/0052487 A1    Feb. 14, 2019

Related U.S. Application Data

(60) Provisional application No. 62/544,616, filed on Aug. 11, 2017, provisional application No. 62/548,573, (Continued)

(51) Int. Cl.
*H04L 1/00* (2006.01)
*H04L 25/03* (2006.01)
(Continued)

(52) U.S. Cl.
CPC ...... *H04L 25/03866* (2013.01); *H03M 13/13* (2013.01); *H04L 1/0038* (2013.01);
(Continued)

(58) Field of Classification Search
CPC .......... H03M 13/6362; H03M 13/136; H03M 13/15; H03M 13/2796
See application file for complete search history.

(56) References Cited

U.S. PATENT DOCUMENTS

| | | | |
|---|---|---|---|
| 2018/0159707 A1* | 6/2018 | Onggosanusi | ........ H04L 67/325 |
| 2019/0028241 A1* | 1/2019 | Ahn | ...................... H04L 1/0057 |
| 2019/0044540 A1* | 2/2019 | Jiang | .................. H03M 13/136 |

OTHER PUBLICATIONS

3GPP TS 36.211 (V8.9.0); "Evolved Universal Terrestrial Radio Access (E-UTRA); Physical Channels and Modulation"; Dec. 2009; 83 pages.

(Continued)

*Primary Examiner* — Ayaz R Sheikh
*Assistant Examiner* — Debebe A Asefa
(74) *Attorney, Agent, or Firm* — Kowert, Hood, Munyon, Rankin & Goetzel, P.C.; Jeffrey C. Hood

(57) ABSTRACT

Methods and devices are described for polar encoding and decoding control information that has been modulated based on one or more identifiers of the transmitter and/or receiver. Some embodiments describe scrambling sequence design for multi-mode block discrimination on control information blind detection and decoding. Separate scrambling masks may be applied to disparate bit fields within a coded DCI message, wherein each of the scrambling masks is derived from a user equipment (UE)-specific identifier, a UE group identifier, or a base station identifier. Frozen bits of the polar code may be used to encode and transmit hybrid automatic repeat request (HARQ) acknowledgment messaging for early retransmission of unsuccessful downlink messages. A tiered process of UE identification may be employed to improve a balance between early termination of the decoding process and success of the UE identification process.

20 Claims, 20 Drawing Sheets

Related U.S. Application Data filed on Aug. 22, 2017, provisional application No. 62/556,598, filed on Sep. 11, 2017, provisional application No. 62/559,724, filed on Sep. 18, 2017, provisional application No. 62/566,922, filed on Oct. 2, 2017.

(51) Int. Cl.

| | | |
|---|---|---|
| *H04L 27/26* | (2006.01) | |
| *H04L 29/08* | (2006.01) | |
| *H04W 72/04* | (2009.01) | |
| *H04W 88/02* | (2009.01) | |
| *H04W 88/08* | (2009.01) | |
| *H03M 13/13* | (2006.01) | |
| *H04L 1/18* | (2006.01) | |
| *H04L 5/00* | (2006.01) | |

(52) U.S. Cl.
CPC .......... *H04L 1/0041* (2013.01); *H04L 1/0053* (2013.01); *H04L 1/0057* (2013.01); *H04L 1/0061* (2013.01); *H04L 1/0072* (2013.01); *H04L 1/1812* (2013.01); *H04L 1/1887* (2013.01); *H04L 5/0055* (2013.01); *H04W 72/042* (2013.01)

(56) References Cited

OTHER PUBLICATIONS

Alexios Balatsoukas-Stimming, Mani Bastani Parizi, and Andreas Burg; "LLR-Based Successive Cancellation List Decoding of Polar Codes"; IEEE Transactions on Signal Processing; Mar. 2015; 15 pages.

International Search Report and Written Opinion, Application No. PCT/US2018/045355, dated Nov. 7, 2018; 15 pages.

AT&T; "Polar code construction for control channels"; 3GPP Draft; RI-1707747: 3rd Generation Partnership Project (3GPP); vol. RAN WG1, no. Hangzhou; May 14, 2017; 2 pages.

Coherent Logix, Inc; "Early Block Discrimination on DCI Blind Detection"; 3GPP DRAFT; RI-1711573; 3RD Generation Partnership Project (3GPP), vol. RAN WG1, No. Qingdao; Jun. 28, 2017; eight pages.

HTC; "Reduced HARQ timing for NR"; 3GPP Draft; RI-1610092; vol. RAN WG1, No. Lisbon, Portugal; Oct. 9, 2016; four pages.

Samsung; "Maximum Polar Code Size"; 3GPP DRAFT; RI-1703004; vol. RAN WG1, No. Athens, Greece; Feb. 12, 2017; six pages.

\* cited by examiner $$\begin{pmatrix}S_0\\S_1\\S_2\\\cdot\\\cdot\\S_{N-1}\end{pmatrix} + \begin{pmatrix}R_0\\R_1\\R_2\\\cdot\\\cdot\\R_{N-1}\end{pmatrix} + \begin{pmatrix}X_0\\X_1\\X_2\\\cdot\\\cdot\\X_{N-1}\end{pmatrix} = \begin{pmatrix}wG_0\\wG_1\\wG_2\\\cdot\\\cdot\\wG_{N-1}\end{pmatrix} = \begin{pmatrix}W_0\\W_1\\W_2\\\cdot\\\cdot\\W_{N-1}\end{pmatrix}$$

$G_n = F_N \triangleq (F_2)^{\otimes n}$ $s_{0:F-1}\ O_{0:D-1}\ O_{0:15}$
$+$
$O_{0:F-1}\ r_{0:D-1}\ O_{0:15}$
$+$
$O_{0:F-1}\ O_{0:D-1}\ x_{0:15}$
$=$
$w_{0:F-1}\ w_{F:A-1}\ w_{A:A+15}$

FIG. 14

SCRAMBLING SEQUENCE DESIGN FOR MULTI-MODE BLOCK DISCRIMINATION ON DCI BLIND DETECTION

PRIORITY CLAIM

This application claims benefit of priority to U.S. Provisional Application No. 62/544,616 titled "Scrambling Sequence Design for Multi-Mode Block Discrimination on DCI Blind Detection" and filed on Aug. 11, 2017, U.S. Provisional Application No. 62/548,573 titled "Scrambling Sequence Design for Multi-Mode Block Discrimination on DCI Blind Detection" and filed on Aug. 22, 2017, U.S. Provisional Application No. 62/556,598 titled "Scrambling Sequence Design for Multi-Mode Block Discrimination on DCI Blind Detection" and filed on Sep. 11, 2017, U.S. Provisional Application No. 62/559,724 titled "Scrambling Sequence Design for Multi-Mode Block Discrimination on DCI Blind Detection" and filed on Sep. 18, 2017, U.S. Provisional Application No. 62/566,922 titled "Scrambling Sequence Design for Multi-Mode Block Discrimination on DCI Blind Detection" and filed on Oct. 2, 2017, all of which are hereby incorporated by reference in their entirety as if fully and completely set forth herein.

FIELD OF THE INVENTION

The field of the invention generally relates to decoders used in wireless communications.

DESCRIPTION OF THE RELATED ART

Decoders are used in many areas of wireless communications. A transmitter may encode a message which is intended for reception by a specific receiver. If the intended receiver does not have a priori knowledge of where (e.g., where in time and/or frequency) to look for the encoded message, it may undergo a blind decoding procedure to search a set of candidate locations for the intended message.

Blind decoding can take considerable time and computational resources, as the receiver may have to perform blind decoding on messages in a large number of candidate locations before the correct message is decoded. Accordingly, improvements in the field are desired.

SUMMARY OF THE EMBODIMENTS

Various embodiments are described of a system and methods for polar encoding and decoding control information that has been modulated based on one or more identifiers of the transmitter and/or receiver. Each of the transmitter or receiver may be a user equipment (UE) or a base station, or another type of transmitter or receiver. Some embodiments describe scrambling sequence design for multi-mode block discrimination on control information blind detection and decoding. Separate scrambling masks may be applied to disparate bit fields within a coded control message, wherein each of the scrambling masks may be derived based on a user equipment (UE)-specific identifier, a UE group identifier, or a base station identifier. In other embodiments, the scrambling mask may be derived based on a payload message, a control message, or a reference sequence of bits known to both the transmitter and receiver.

In some embodiments, frozen bits of the polar code may be used to encode and transmit hybrid automatic repeat request (HARQ) acknowledgment messaging for early retransmission of unsuccessful downlink messages.

In some embodiments, a tiered process of UE identification may be employed to improve a balance between early termination of the decoding process and success of the UE identification process.

This Summary is intended to provide a brief overview of some of the subject matter described in this document. Accordingly, it will be appreciated that the above-described features are merely examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE DRAWINGS

A better understanding of the present invention can be obtained when the following detailed description of the preferred embodiment is considered in conjunction with the following drawings, in which:

FIG. 14 illustrates a successive bit-mask assignment, according to some embodiments;

Figure 1:
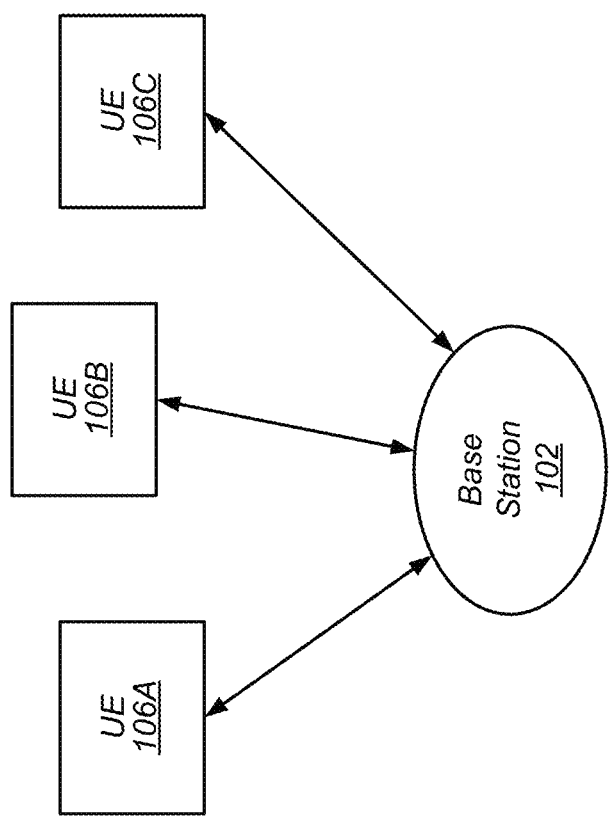
FIG. 1 is a diagram illustrating a wireless communication environment, according to some embodiments.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF EMBODIMENTS OF THE INVENTION

Incorporation by Reference

The following references are hereby incorporated by reference in their entirety as though fully and completely set forth herein:
1. "Polar Code Construction for NR", Huawei, HiSilicon, 3GPP TSG RAN WG1 Meeting #86bis, October 2016.
2. Alexios Balatsoukas-Stimming, Mani Bastani Parizi, and Andreas Burg, "LLR-Based Successive Cancellation List Decoding of Polar Codes", IEEE Transactions on Signal Processing, March 2015.
3. 3GPP TS 36.211: "Evolved Universal Terrestrial Radio Access (E-UTRA); Physical Channels and Modulation".
4. Provisional Patent Application No. 62/455,448, titled "Early Block Discrimination with Polar Codes to Further Accelerate DCI Blind Detection".
5. Provisional Patent Application No. 62/501,493, titled "Early Block Discrimination with Polar Codes to Further Accelerate DCI Blind Detection".

Terms

The following is a glossary of terms used in the present application:

Memory Medium—any of various types of memory devices or storage devices. The term "memory medium" is intended to include an installation medium, e.g., a CD-ROM, floppy disks, or tape device; a computer system memory or random access memory such as DRAM, DDR RAM, SRAM, EDO RAM, Rambus RAM, etc.; or a non-volatile memory such as a magnetic media, e.g., a hard drive, optical storage, or ROM, EPROM, FLASH, etc. The memory medium may comprise other types of memory as well, or combinations thereof. In addition, the memory medium may be located in a first computer in which the programs are executed, and/or may be located in a second different computer which connects to the first computer over a network, such as the Internet. In the latter instance, the second computer may provide program instructions to the first computer for execution. The term "memory medium" may include two or more memory mediums which may reside in different locations, e.g., in different computers that are connected over a network.

Carrier Medium—a memory medium as described above, as well as a physical transmission medium, such as a bus, network, and/or other physical transmission medium that conveys signals such as electrical or optical signals.

Programmable Hardware Element—includes various hardware devices comprising multiple programmable function blocks connected via a programmable or hardwired interconnect. Examples include FPGAs (Field Programmable Gate Arrays), PLDs (Programmable Logic Devices), FPOAs (Field Programmable Object Arrays), and CPLDs (Complex PLDs). The programmable function blocks may range from fine grained (combinatorial logic or look up tables) to coarse grained (arithmetic logic units or processor cores). A programmable hardware element may also be referred to as "reconfigurable logic".

Application Specific Integrated Circuit (ASIC)—this term is intended to have the full breadth of its ordinary meaning. The term ASIC is intended to include an integrated circuit customized for a particular application, rather than a general purpose programmable device, although an ASIC may contain programmable processor cores as building blocks. Cell phone processors, MP3 player chips, and many other single-function ICs are examples of ASICs. An ASIC is usually described in a hardware description language such as Verilog or VHDL.

Program—the term "program" is intended to have the full breadth of its ordinary meaning. The term "program" includes 1) a software program which may be stored in a memory and is executable by a processor or 2) a hardware configuration program useable for configuring a programmable hardware element or ASIC.

Software Program—the term "software program" is intended to have the full breadth of its ordinary meaning, and includes any type of program instructions, code, script and/or data, or combinations thereof, that may be stored in a memory medium and executed by a processor. Exemplary software programs include programs written in text-based programming languages, e.g., imperative or procedural languages, such as C, C++, PASCAL, FORTRAN, COBOL, JAVA, assembly language, etc.; graphical programs (programs written in graphical programming languages); assembly language programs; programs that have been compiled to machine language; scripts; and other types of executable software. A software program may comprise two or more software programs that interoperate in some manner.

Hardware Configuration Program—a program, e.g., a netlist or bit file, that can be used to program or configure a programmable hardware element or ASIC.

Computer System—any of various types of computing or processing systems, including a personal computer system (PC), mainframe computer system, workstation, network appliance, Internet appliance, personal digital assistant (PDA), grid computing system, or other device or combinations of devices. In general, the term "computer system" can be broadly defined to encompass any device (or combination of devices) having at least one processor that executes instructions from a memory medium.

Automatically—refers to an action or operation performed by a computer system (e.g., software executed by the computer system) or device (e.g., circuitry, programmable hardware elements, ASICs, etc.), without user input directly specifying or performing the action or operation. Thus the term "automatically" is in contrast to an operation being manually performed or specified by the user, where the user provides input to directly perform the operation. An automatic procedure may be initiated by input provided by the user, but the subsequent actions that are performed "automatically" are not specified by the user, i.e., are not performed "manually", where the user specifies each action to perform. For example, a user filling out an electronic form by selecting each field and providing input specifying information (e.g., by typing information, selecting check boxes, radio selections, etc.) is filling out the form manually, even though the computer system must update the form in response to the user actions. The form may be automatically filled out by the computer system where the computer system (e.g., software executing on the computer system) analyzes the fields of the form and fills in the form without any user input specifying the answers to the fields. As indicated above, the user may invoke the automatic filling of the form, but is not involved in the actual filling of the form (e.g., the user is not manually specifying answers to fields but rather they are being automatically completed). The present specification provides various examples of operations being automatically performed in response to actions the user has taken.

DETAILED DESCRIPTION

FIG. 1—Wireless Communication Environment

FIG. 1 illustrates an exemplary (and simplified) wireless environment that includes multiple communication systems. FIG. 1 shows an example communication system involving a base station (BS) 102 communicating with a plurality of user equipment devices (UEs) 106A-C. The base station 102 may be a cellular base station which performs cellular communications with a plurality of wireless communication devices. Alternatively, the base station 102 may be a wireless access point for performing Wi-Fi communications, such as according to the 802.11 standard or related standards. The UEs 106 may be any of various devices such as a smart phone, tablet device, computer system, etc. One or both of the base station 102 and the wireless communication device 106 may include decoder logic as described herein.

In the illustrated embodiment, different UEs and the base station are configured to communicate via a broadcast network and/or a packet-switched cellular network. It is noted that the system of FIG. 1 is merely one example of possible systems, and embodiments may be implemented in any of various systems, as desired.

Cellular base station 102 may be a base transceiver station (BTS) or cell site, and may include hardware that enables wireless communication with the UEs 106A-C. The base station 102 may also be configured to communicate with a core network. The core network may be coupled to one or more external networks, which may include the Internet, a Public Switched Telephone Network (PSTN), and/or any other network. Thus, the base station 102 may facilitate communication between the UE devices 106A-C and a network.

Base station 102 and other base stations operating according to the same or different radio access technologies (RATs) or cellular communication standards may be provided as a network of cells, which may provide continuous or nearly continuous overlapping service to UEs 106A-C and similar devices over a wide geographic area via one or more RATs.

The base station 102 may be configured to broadcast communications to the UEs 106A-C. The term "broadcast" herein may refer to one-to-many transmissions that are transmitted for receiving devices in a broadcast area rather than being addressed to a particular device. Further, broadcast transmissions are typically unidirectional (from transmitter to receiver). In some situations, control signaling (e.g., ratings information) may be passed back to a broadcast transmitter from the receivers, but the content data is transmitted in only one direction. In contrast, cellular communication is typically bi-directional. Cellular communications may also involve handoff between cells. For example, when UE 106A (and/or UEs 106B-C) moves out of the cell served by cellular base station 102, it may be handed over to another cellular base station (and the handover may be handled by the network, including operations performed by base station 102 and the other cellular base station). In contrast, when a user moves from the range covered by a first broadcast base station to the range covered by a second broadcast base station, it may switch to receiving content from the second broadcast base station, but the base stations do not need to facilitate handover (e.g., they simply continue broadcasting and do not care which base station a particular UE is using).

Traditionally, broadcast transmissions are performed using different frequency resources than cellular transmissions. In some embodiments, however, frequency resources are shared between these different types of transmissions. For example, in some embodiments, a broadcast base station is configured to relinquish one or more frequency bands during scheduled time intervals for use by a cellular base station for packet-switched communications.

In some embodiments, control signaling transmitted by a broadcast or cellular base station may allow end user devices to maintain full signaling connectivity (which may eliminate network churn), extend battery life (e.g., by determining when to remain in a low power mode when a base station is not transmitting), and/or actively manage coverage detection (e.g., rather than perceiving spectrum sharing periods as spotty coverage or a temporary network outage).

The base station 102 and the UEs 106A, 106B, and 106C may be configured to communicate over the transmission medium using any of various RATs (also referred to as wireless communication technologies or telecommunication standards), such as LTE, 5G New Radio (NR), Next Generation Broadcast Platform (NGBP), W-CDMA, TDS-CDMA, and GSM, among possible others such as UMTS, LTE-A, CDMA2000 (e.g., 1×RTT, 1×EV-DO, HRPD, eHRPD), Advanced Television Systems Committee (ATSC) standards, Digital Video Broadcasting (DVB), satellite communication standards, etc.

Broadcast and cellular networks are discussed herein to facilitate illustration, but these technologies are not intended to limit the scope of the present disclosure and the disclosed method and techniques may be used between any of various types of wireless networks, in other embodiments.

Figure 2:
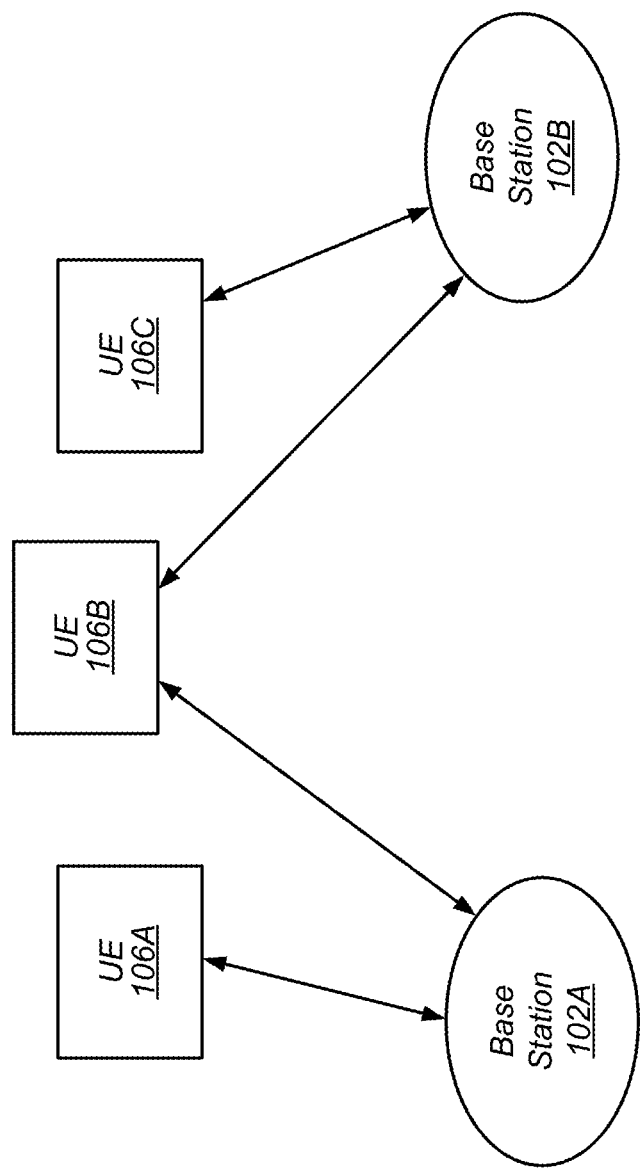
FIG. 2 is a diagram illustrating a wireless communication environment with base station coverage overlap, according to some embodiments.

FIG. 2—Wireless Communication Environment with Multiple Base Stations

FIG. 2 illustrates an exemplary wireless communication system that includes base stations 102A and 102B which communicate over a transmission medium with one or more user equipment (UE) devices, represented as UEs 106A-106C. The communication environment in FIG. 2 may function similarly to that described in FIG. 1, above. However, FIG. 2 illustrates that the center UE 106B may operate within range of both of the base stations 102A and 102B. In these embodiments, UE 106B may mistakenly receive a communication from BS 102B when it was intending to receive communications from BS 102A. This effect may be referred to as intercell interference, and embodiments herein describe novel methods for efficiently avoiding intercell interference in cell coverage overlap areas.

Figure 3:
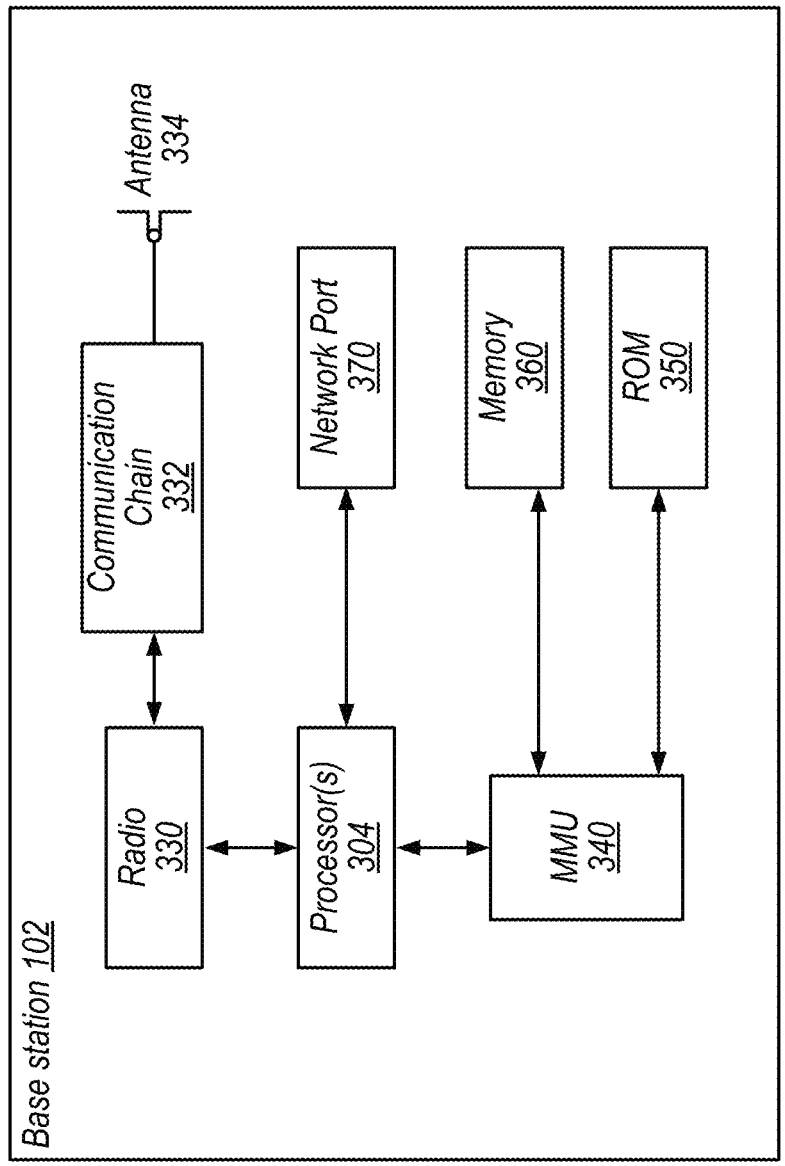
FIG. 3 is a block diagram illustrating an exemplary base station, according to some embodiments.

FIG. 3—Base Station

FIG. 3 illustrates an exemplary block diagram of a base station 102. In some embodiments, base station 102 may be a broadcast base station such as base station 102A of FIG. 2 and/or a cellular base station such as base station 102B of FIG. 2. It is noted that the base station of FIG. 3 is merely one example of a possible base station. As shown, the base station 102 may include processor(s) 304 which may execute program instructions for the base station 102. The processor(s) 304 may also be coupled to memory management unit (MMU) 340, which may be configured to receive addresses from the processor(s) 304 and translate those addresses to locations in memory (e.g., memory 360 and read only memory (ROM) 350) or to other circuits or devices.

The base station 102 may include at least one network port 370. The network port 370 may be configured to couple to a telephone network and provide a plurality of devices, such as UE devices 106, access to the telephone network as described above. In some embodiments, the network port 370 (or an additional network port) may be coupled to a television network and configured to receive content for broadcasting. The network port 370 (or an additional network port) may also or alternatively be configured to couple to a cellular network, e.g., a core network of a cellular service provider. The core network may provide mobility related services and/or other services to a plurality of devices, such as UE devices 106. In some cases, the network port 370 may couple to a telephone network via the core network, and/or the core network may provide a telephone network (e.g., among other UE devices 106 serviced by the cellular service provider).

The base station 102 may include at least one antenna 334. The radio 330 and communication chain 332 may be configured to operate as a wireless transceiver and may be further configured to communicate with UE devices 106 via radio 330. The antenna 334 communicates with the radio 330 via communication chain 332 in the illustrated embodiment. Communication chain 332 may be a receive chain, a transmit chain or both. The radio 330 may be configured to communicate via various RATs.

The processor(s) 304 of the base station 102 may be configured to implement part or all of the methods described herein, e.g., by executing program instructions stored on a memory medium (e.g., a non-transitory computer-readable memory medium). Alternatively, the processor 304 may be configured as a programmable hardware element, such as an FPGA (Field Programmable Gate Array), or as an ASIC (Application Specific Integrated Circuit), or a combination thereof. In some embodiments, the processor, MMU, and memory may be a distributed multiprocessor system. For example, the processor system may comprise a plurality of interspersed processors and memories, where processing elements (also called functional units) are each connected to a plurality of memories, also referred to as data memory routers. The processor system may be programmed to implement the methods described herein.

In some embodiments, base station 102 is configured to perform both broadcast and bi-directional packet-switched communications. In these embodiments, base station 102 may include multiple radios 330, communication chains 332, and/or antennas 334, for example. In other embodiments, the disclosed spectrum sharing techniques may be performed by different base stations configured to perform only broadcast transmissions or only packet-switched communications.

Figure 4:
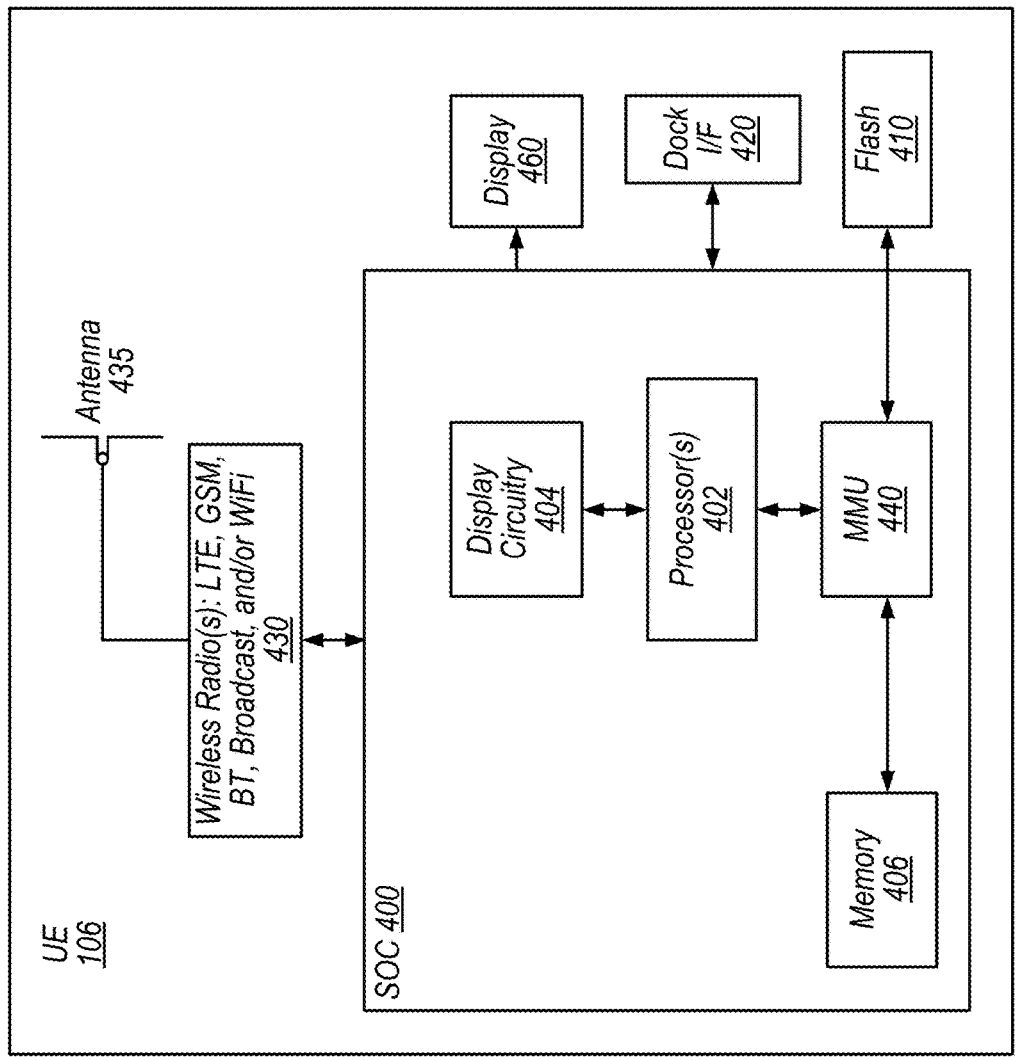
FIG. 4 is a block diagram illustrating an exemplary UE, according to some embodiments.

FIG. 4—User Equipment (UE)

FIG. 4 illustrates an example simplified block diagram of a UE 106. The term UE 106 may be any of various devices as defined above. UE device 106 may include a housing which may be constructed from any of various materials.

As shown, the UE 106 may include a system on chip (SOC) 400, which may include portions for various purposes. The SOC 400 may be coupled to various other circuits of the UE 106. For example, the UE 106 may include various types of memory (e.g., including NAND flash 410), a connector interface 420 (e.g., for coupling to a computer system, dock, charging station, etc.), the display 460, wireless communication circuitry 430 such as for LTE, 5G New Radio (NR), GSM, Bluetooth, WLAN, terrestrial broadcast and/or satellite broadcast, etc. The UE 106 may further comprise one or more smart cards that implement SIM (Subscriber Identity Module) functionality. The wireless communication circuitry 430 may couple to one or more antennas, such as antenna 435.

As shown, the SOC 400 may include processor(s) 402 which may execute program instructions for the UE 106 and display circuitry 404 which may perform graphics processing and provide display signals to the display 460. The processor(s) 402 may also be coupled to memory management unit (MMU) 440, which may be configured to receive addresses from the processor(s) 402 and translate those addresses to locations in memory (e.g., memory 406, NAND flash memory 410) and/or to other circuits or devices, such as the display circuitry 404, wireless communication circuitry 430, connector U/F 420, and/or display 460. The MMU 440 may be configured to perform memory protection and page table translation or set up. In some embodiments, the MMU 440 may be included as a portion of the processor(s) 402. In some embodiments, the processor, MMU, and memory may be a distributed multiprocessor system. For example, the processor system may comprise a plurality of interspersed processors and memories, where processing elements (also called functional units) are each connected to a plurality of memories, also referred to as data memory routers. The processor system may be programmed to implement the methods described herein.

In some embodiments (not shown), UE 106 is configured to receive wireless broadcasts, e.g., from broadcast base station 102A of FIG. 2. In these embodiments, 106 may include a broadcast radio receiver. In some embodiments, UE 106 is configured to receive broadcast data and perform packet-switched cellular communications (e.g., LTE) at the same time using different frequency bands and/or the same frequency resources during different time slices. This may allow users to view TV broadcasts while performing other tasks such as browsing the internet (e.g., in a split-screen mode), using web applications, or listening to streaming audio. In other embodiments, the disclosed techniques may be used in systems with devices that are configured as broadcast receivers or for cellular communications, but not both.

The processor 402 of the UE device 106 may be configured to implement part or all of the features described herein, e.g., by executing program instructions stored on a memory medium (e.g., a non-transitory computer-readable memory medium). Alternatively (or in addition), processor 402 may be configured as a programmable hardware element, such as an FPGA (Field Programmable Gate Array), or as an ASIC (Application Specific Integrated Circuit). Alternatively (or in addition) the processor 402 of the UE device 106, in conjunction with one or more of the other components 400, 404, 406, 410, 420, 430, 435, 440, 460 may be configured to implement part or all of the features described herein.

UE 106 may have a display 460, which may be a touch screen that incorporates capacitive touch electrodes. Display 460 may be based on any of various display technologies. The housing of the UE 106 may contain or comprise openings for any of various elements, such as buttons, speaker ports, and other elements (not shown), such as a microphone, data port, and possibly various types of buttons, e.g., volume buttons, ringer button, etc.

The UE 106 may support multiple radio access technologies (RATs). For example, UE 106 may be configured to communicate using any of various RATs such as two or more of Global System for Mobile Communications (GSM), Universal Mobile Telecommunications System (UMTS), Code Division Multiple Access (CDMA) (e.g., CDMA2000 1×RTT or other CDMA radio access technologies), Long Term Evolution (LTE), LTE Advanced (LTE-A), 5G NR, and/or other RATs. For example, the UE 106 may support at least two radio access technologies such as LTE and GSM. Various different or other RATs may be supported as desired.

In some embodiments, UE 106 is also configured to receive broadcast radio transmissions which may convey audio and/or video content. In still other embodiments, a UE 106 may be configured to receive broadcast radio transmissions and may not be configured to perform bi-directional communications with a base station (e.g., UE 106 may be a media playback device).

UE-Specific Control Messages

In current cellular communication systems, a base station may broadcast a plurality of control messages (e.g., downlink control information messages) that are each intended for reception by a specific user equipment device (UE). To ensure that the correct UE receives a particular message, in some embodiments, the base station may append a cyclic redundancy check (CRC) at the end of the control message, which is sometimes referred to as a final CRC. Additionally or alternatively, a distributed CRC may be employed whereby CRC bits are distributed throughout the information bits and/or frozen bits of the control message. In some embodiments, the base station may scramble a CRC that is attached to certain downlink control information (DCI) messages according to a user equipment identifier (UE_ID). A particular UE_ID may be associated with a single UE or with a group of one or more UEs. In these embodiments, if the wrong UE (e.g., a UE with a different UE_ID than that used to scramble the CRC) attempts to descramble the CRC, it may result in a CRC error and the message may be dropped. Thus, only the UE with a matching UE_ID may be able to correctly descramble the CRC and acknowledge the DCI message. If a UE receives a message in a resource block for which the CRC is unsuccessful, the UE may assume that the message is not intended for that UE and may drop the message.

While appending a final scrambled CRC to a control message may be an effective way to verify that the message is received by the correct UE, the method often requires that the entire control message be decoded before the check can be performed. Embodiments described herein improve on this methodology by enabling various methods for performing early termination for a mismatched UE_ID during the decoding process. Embodiments herein further improve on this methodology by mitigating intercell interference by scrambling a subset of the control message based on a CELL_ID.

According to some embodiments described herein, a proposed method leverages properties of polar codes whereby information known to the transmitter and receiver can be inserted in frozen bits and/or information bits to expedite transmitter and/or receiver ID verification. For example, a shortcoming of typical CRC methods is that the UE cannot perform the CRC check until after the entire message has been decoded. By leveraging properties of polar codes, embodiments described herein allow a UE to determine whether a message was intended for the UE before the decoding process is completed. In these embodiments, a pseudorandom sequence generated based on the UE_ID may be embedded in the frozen bits to help a receiver discern blocks meant for it versus those intended for another user. Advantageously, this may be done without affecting the code rate, user throughput or decoding reliability. Given the limited extent of the UE_ID relative to the typical number of available frozen bits, the method may obtain a pseudorandom bit sequence that matches the extent of the frozen bit field, where the pseudorandom bit sequence is based on the UE_ID.

In current cellular communication systems (e.g., LTE, and potentially NR), a base station (i.e. eNodeB or eNB in LTE or gNB in NR) may multiplex DCIs for multiple UEs in a set of predefined candidate locations. This places a particular burden on the UE which, employing a blind detection procedure, may interrogate each candidate location to identify the DCIs intended for it versus those meant for other users.

Embodiments herein expedite the blind detection procedure, as the gNB may scramble the frozen bits of a polar code with a UE-specific mask to facilitate user identification. In some embodiments, the information bits of the DCI may additionally be scrambled according to a cell-specific mask to mitigate adjacent cell interference.

While embodiments herein may be described in reference to a base station communication with a UE device, it can be readily understood that the methods described may be generally applied to many different kinds of transmitters and receivers. In particular, any transmitter/receiver pair may benefit from implementation of embodiments described herein, if the transmitter is attempting to transmit communications to a particular receiver, and if there is a need for the receiver to verify both or either of: a) the identification of the transmitter and/or b) that the transmission was intended for the particular receiver. Additionally, while some embodiments are described in reference to LTE or 5G NR radio access technologies, the embodiments described may be applied more broadly to other types of radio access technologies.

Embodiments herein describe a scrambling sequence design that builds on the objectives set forth by LTE and, leveraging attributes unique to polar codes, extends the design capabilities to include multi-mode block discrimination with the potential for early termination in a unified framework. In some embodiments, separate masks are assigned to respective portions of the polar code construction, each with a distinct purpose: UE identification, early termination of blind decoding to minimize energy expended on blocks not intended for the present user, and/or adjacent cell interference mitigation. Early termination of blind decoding may advantageously reduce overall energy consumption for mobile devices.

In some embodiments, methods are presented that retain the CRC scrambling used by LTE. In some embodiments, the CRC may be scrambled in a different manner than used by LTE. In some embodiments, a UE-specific pseudorandom binary sequence (PRBS), inserted in the polar code frozen bit-field, may enable early termination. These embodiments may improve on previous implementations, wherein the entire message has to be decoded before the CRC may be performed. Given superior cross-correlation properties, the PRBS may provide improved code separation beyond that afforded by CRC scrambling alone.

In some embodiments a second PRBS mask, derived from the CELL_ID, is applied to the information bit field affording cell separation analogous to that available with LTE. In some embodiments, each of the first and second PRBS masks may be applied together as an ensemble in a unified discrimination mask that simultaneously enables user identification with early termination as well as adjacent cell interference mitigation.

Early Termination (ET) Metrics

In some embodiments, early block discrimination relies on an early identity verification based on a prescribed frozen bit encoding well in advance of the final CRC. The receiver may choose at any point in the decoding process to terminate a block deemed not intended for the present receiver. An effective ET metric may advantageously reduce the energy spent examining blocks meant for another user, while also reducing the chance of misinterpreting that a block intended for the receiver is a mismatch.

A variety of metrics may be derived from the embedded UE_ID to facilitate early termination. The requisites for an effective ET metric may include but are not limited to: (i) that the metric employ only those parameters accessible on a per bit basis within the decoder; (ii) to the extent possible leverage computations already integral to a representative class of decoder algorithms; (iii) otherwise align computational load and finite-precision requirements to those used by the baseline decoder.

In various embodiments, different early termination metrics may be employed. In some embodiments, a threshold may be applied to discriminate path metric (PM) growth in the match case from that in the mismatch case. In some embodiments, ET metrics may include direct sequence detection and PM distribution about a mean at each bit position as compared to the PM growth. Other ET metrics to discriminate a match from a mismatch are also possible, as apparent to one of ordinary skill in the art.

Tiered UE Identification

As explained in further detail below, in some embodiments numerous criteria may be used to terminate a block based on a mismatch in assigned UE_ID. The first available ET determination may be made with regard to UE_ID insertion on frozen bits. A PASS in the corresponding ET metric may be used to indicate the need to further assess the validity of the presumed UE_ID based first on a check of the distributed CRC. If the distributed CRC check passes, UE_ID validation may then be subjected to a check of the final CRC. Finally, a pass of all three metrics may result in a valid DCI decoding. Failure with regard to frozen bit insertion or distributed CRC is intended to yield a net savings in processing time/energy. Failure with regard to the final CRC may prevent an erroneous decoding from passing on for further processing.

Overview of Example EUTRA DCI Formats

Embodiments herein may be employed in regard to downlink control information (DCI) messages that are used according to various DCI formats. For example, as detailed below in Table 1, 3GPP EUTRA (Evolved Universal Terrestrial Radio Access) specifies a range of DCI formats as follows:

Format 0 schedules uplink (UL) resources on the physical uplink shared channel (PUSCH).

Formats 1, 1A, 1B, 1C, 1D, 2, 2A schedule downlink (DL) resources on the physical downlink shared channel (PDSCH).

Formats 3 and 3A signal transmit power control (TPC) commands for PUSCH and the physical uplink control channel (PUCCH).

TABLE 1

DCI Formats

| DCI Format | Purpose | Number of bits including CRC (for a system bandwidth of 50 resource blocks and 4 antennas at the gNB) |
|---|---|---|
| 0 | PUSCH grants | 42 |
| 1 | PDSCH assignments with a single codeword | 47 |
| 1A | PDSCH assignments using a compact format | 42 |
| 1B | PDSCH assignments for rank-1 transmission | 46 |
| 1C | PDSCH assignments using a very compact format | 26 |
| 1D | PDSCH assignments for multi-user MIMO | 46 |
| 2 | PDSCH assignments for closed-loop MIMO operation | 62 |
| 2A | PDSCH assignments for open-loop MIMO operation | 58 |
| 3 | Transmit Power Control (TPC) commands for multiple users for PUCCH and PUSCH with 2-bit power adjustments | 42 |
| 3A | Transmit Power Control (TPC) commands for multiple users for PUCCH and PUSCH with 1-bit power adjustments | 42 |

Note that DCI formats 0, 1A, 3, and 3A all have the same bit length for a given system bandwidth. This may allow a receiver to check for any of this group of DCI formats with only a single blind decoding attempt (with that blind decoding being based on the expected bit length). In the event of a successful decoding, additional information such as the Radio Network Temporary Identifier (RNTI) used to scramble the DCI's CRC and/or an internal bit flag within the DCI payload may be used to determine exactly which DCI format is present.

While Table 1 illustrates a particular set of DCI formats used in current 3GPP EUTRA implementations, other DCI formats are also possible (e.g., in 5G NR or other radio access technologies).

Figure 5:
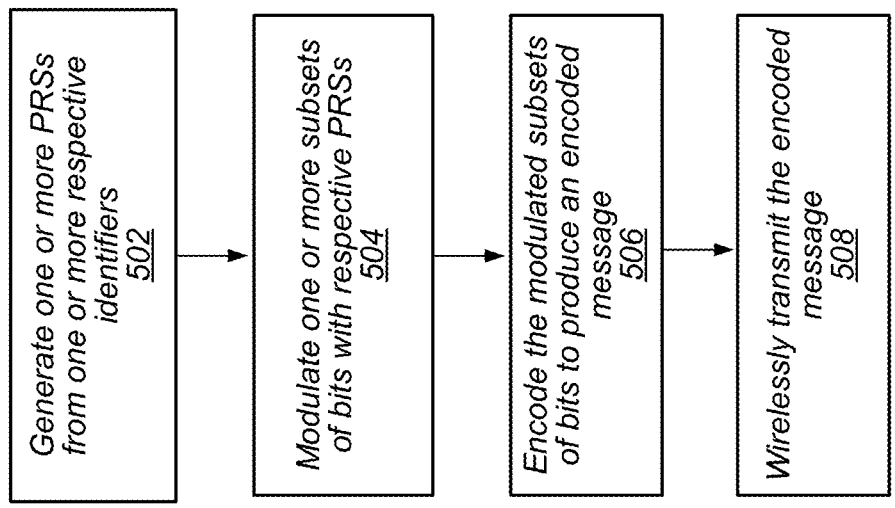
FIG. 5 is a flow diagram illustrating a method for modulating and encoding a sequence of bits, according to some embodiments.

FIG. 5—Modulating and Encoding Information

FIG. 5 illustrates a flowchart diagram for a method for performing multimode block discrimination when modulating and encoding a message by a transmitter, according to some embodiments. In some embodiments, separate scrambling masks may be applied to each of a plurality of different blocks within an encoded message. Each of the separate scrambling masks may serve to verify by the receiver an identity of either the transmitter or the receiver. For example, and as described in greater detail below, both the transmitter and the receiver may be preconfigured with knowledge of the transmitter and/or receiver identities, such that the receiver may be able to selectively demask respective blocks of the scrambled message. In some embodiments, the transmitter may be a base station and the receiver may be a user equipment device (UE). Alternatively, both the transmitter and receiver may be UEs, or the transmitter may be a UE and the receiver may be a base station.

In some embodiments, a transmitter may employ a polar coding scheme to encode a message that is intended for a specific receiver. In some embodiments, the encoded message may be a downlink control information (DCI) message, although other types of control messages, and in general any type of transmitted message may be used according to embodiments described herein. While embodiments herein may be described in terms of DCI messages, it may be appreciated by those of skill in the art that the described embodiments may be generalized to other types of transmitted control messages and other types of messages (e.g., uplink control messages, payload messages, etc.).

Polar coding, as described in greater detail below, divides (or 'polarizes') a plurality of communication channels into more reliable and less reliable channels. The more reliable channels are often used to carry the payload information of the communication, and these bits of the communication are often referred to as 'information bits'. In some embodiments, the transmitter may append a sequence of cyclic redundancy check (CRC) bits at the end of the information bits. The less reliable channels typically contain reference bits that are known to both the transmitter and the receiver, commonly referred to as 'frozen bits'. The frozen bits may be utilized by the receiver to facilitate the decoding process.

While embodiments herein are described in terms of polar codes, it may be appreciated that the methods described may also be applied to various other coding schemes. For example, embodiments herein may be applied to other types of forward error correction (FEC) codes, and more generally to any type of encoded message.

In the method described in FIG. 5, the transmitter may generate an encoded message from a plurality of subsets of bits. In various embodiments, the subsets of bits may be contiguous, non-contiguous, or may partially overlap. In some embodiments, the transmitter may generate the encoded message using a polar code, and the plurality of subsets of bits used to generate the encoded message may comprise frozen bits and information bits. In some embodiments, the information bits may comprise payload information bits and/or cyclic redundancy check (CRC) bits.

At 502, a pseudorandom sequence (PRS) may be derived from or based on an identifier that is known to both the transmitter and receiver. In some embodiments, the identifier may identify the transmitter (e.g., CELL_ID or base station ID) or the receiver (e.g., UE_ID). As described in further detail below, each of the one or more identifiers may be used to generate a respective pseudorandom sequence that is generated to be the same length as the respective subset of encoded bits for which the pseudorandom sequence will be applied as a scrambling mask.

In some embodiments, and as described in greater detail below, a first pseudorandom sequence may be generated based on a UE group identifier, and a second pseudorandom sequence may be generated based on a UE-specific identifier. For example, the UE group identifier may be a generic identifier to a group of UEs comprising one or more UEs being serviced by the base station, and the UE-specific identifier may be specific to a particular UE. In these embodiments, the part of the message that is modulated based on the UE-specific identifier may be decodable by a specific UE corresponding to the UE-specific identifier.

In some embodiments, the UE group identifier is a broadcast radio network temporary identifier (RNTI) that is useable by a UE in communication with the base station to demodulate the plurality of frozen bits. In other embodiments, the UE group identifier is a group RNTI that is useable by a group of at least one UE in communication with the base station to demodulate the plurality of frozen bits.

In some embodiments, the group identifier is a multi-identifier, wherein a single demodulation algorithm that may be used to demodulate the subset of bits that has been modulated using the group identifier may additionally be used to demodulate one or more additional subsets of bits that have been modulated by one or more additional identifiers. In other words, the group identifier may be a "multi-to-one" identifier, wherein the group identifier is in a family of one or more additional related identifiers that may each be used to produce modulated bits that are capable of being demodulated by a single demodulation algorithm.

At 504, the transmitter may apply separate scrambling 'masks' to modulate one or more of the plurality of subsets of bits. The application of a scrambling mask may involve modulating each subset of bits with its respective PRS of bits.

For example, a UE_ID corresponding to the intended receiver may be used to generate a first PRS that is the same length as a frozen bit sequence in a polar code. The first PRS may be used to modulate the frozen bits of the polar code. In other embodiments, the first PRS may be the same length as a subset of frozen bits, and may be used to modulate only the subset of frozen bits. Alternatively or additionally, a CELL_ID of the transmitter may be used to generate a second PRS that is the same length as the information bit sequence of the polar code, or has the same length as a subset of the information bits. The second PRS may be used to modulate the information bits of the polar code. Alternatively or additionally, a UE_ID corresponding to the intended receiver may be used to generate a third PRS that is the same length as the CRC bits that will be appended as the final sequence of information bits. The third PRS may be used to modulate the CRC bits.

In the case where only a subset of the frozen bits is modulated based on a first identifier (or a PRS generated based on the first identifier), the subset of frozen bits to be modulated may be selected such that those frozen bits occur within the control information after an information bit with a predetermined threshold level of reliability. For example, later bits in polar coding are more reliable, and the modulated subset of frozen bits may be selected such that the subset of bits occurs late enough to have a predetermined threshold level of reliability. Selecting a subset of frozen bits for modulation that occurs later in the control information also introduces additional latency into the decoding procedure. In some embodiments, the subset of frozen bits may be selected to balance a reliability and a latency associated with the decoding of the encoded modulated control information by a UE.

In some embodiments, a first pseudorandom sequence generated based on a UE group identifier may be used to modulate at least a subset of the frozen bits (i.e., either all or some of the frozen bits), and a second pseudorandom sequence generated based on a UE-specific identifier may be used to modulate at least a subset of the information bits (i.e., either all or some of the information bits). In some embodiments, the at least a subset of the information bits that are modulated based on the second pseudorandom sequence may comprise the CRC bits, and modulating the at least a subset of the information bits with the second pseudorandom sequence to produce the plurality of modulated information bits may comprise performing a CRC mask on the control information.

In some embodiments, performing the CRC mask may comprise implementing a rolling security code, wherein the rolling security code is initialized based on the UE-specific identifier, and wherein the second pseudorandom sequence is periodically updated based on the rolling security code. In some embodiments, additional encryption may be used to increase the security of the CRC mask, in addition to or alternatively to the rolling security code.

At 506, the transmitter may encode, using the polar code, at least each of the subsets of modulated bits to obtain a polar encoded message. For example, in some embodiments the transmitter may encode at least the modulated frozen bits and the modulated information bits to obtain encoded modulated control information, wherein the encoded modulated control information comprises UE-specific control information.

In some embodiments, said encoding at least the plurality of modulated frozen bits and the plurality of modulated information bits to obtain the encoded modulated control information may further comprise encoding, using the polar code, at least one or more of an unmodulated subset of the frozen bits and an unmodulated subset of the information bits to obtain the encoded modulated control information. In other embodiments, the entire set of frozen bits and/or information bits may be modulated, such that there are no unmodulated frozen bits and/or information bits to encode. In any case, the entire set of frozen bits and information bits will generally be encoded to produce the polar encoded message.

At 508, the transmitter may transmit, in a wireless manner, the encoded message to the receiver. The transmission may occur using any of a variety of wireless communication technologies, as described variously in the present disclosure.

Figure 6:
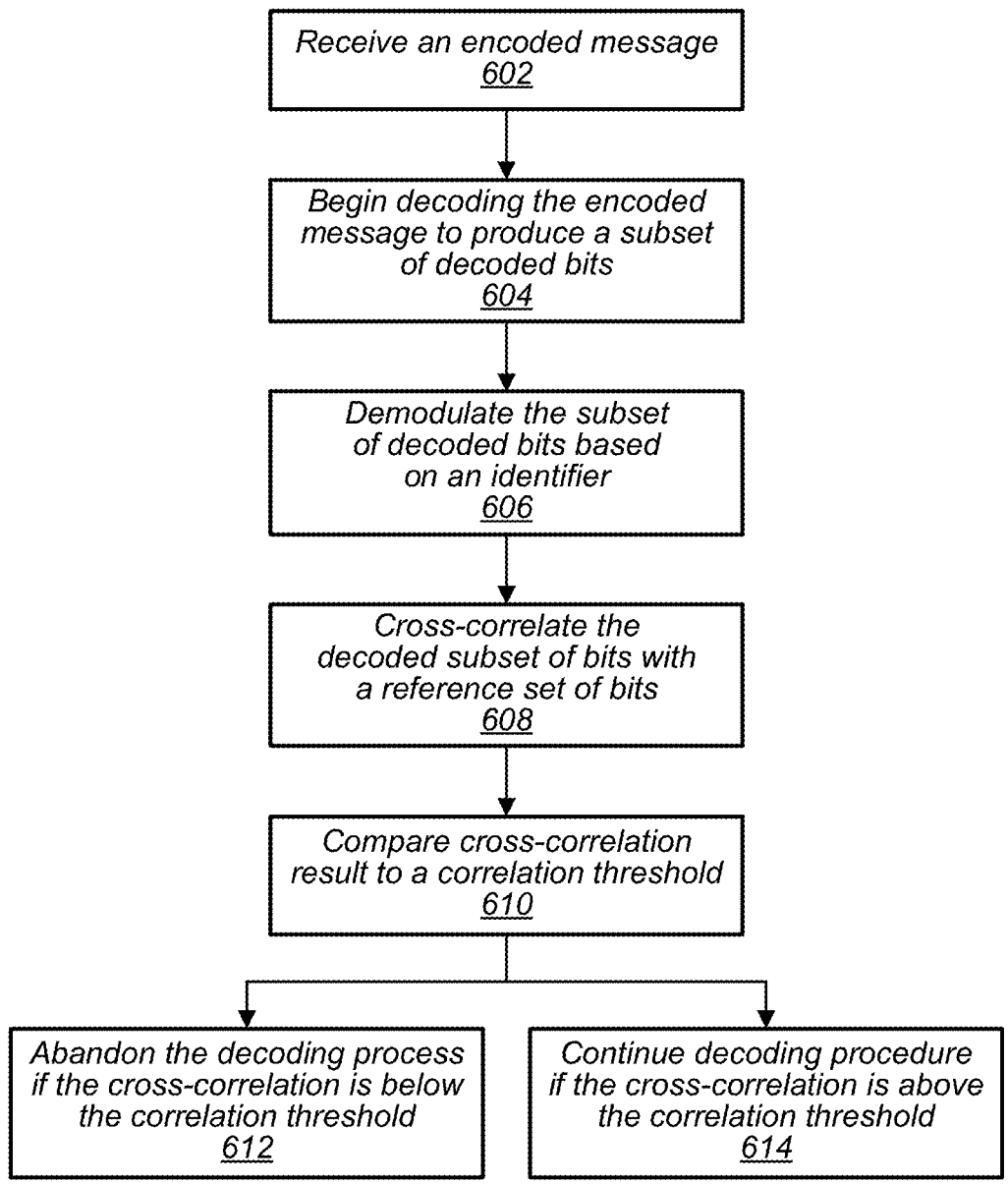
FIG. 6 is a flow diagram illustrating a method for decoding and demodulating a received message, according to some embodiments.

FIG. 6—Demodulating and Decoding an Encoded Message

FIG. 6 is a flowchart diagram illustrating a method for decoding and demodulating an encoded message (e.g., coded data, or polar coded data received from a remote transmitter) by a receiver, according to some embodiments. The receiver may be a user equipment device (UE) comprising a radio, a non-transitory computer-readable memory medium, and a processor (e.g., as described above in reference to FIG. 4), a base station, or it may be another kind of receiver.

At 602, the receiver may receive the encoded message from a transmitter in a wireless manner. The encoded message may comprise coded data including an encoding of one or more sequences of bits (e.g., a first sequence of bits and potentially a second and third sequence of bits). The receiver may have knowledge of each of the identifiers used by the transmitter to modulate respective subsets of bits of the encoded message. The encoded message may be a polar coded message, and the one or more sequences of bits may include a sequence of frozen bits, a sequence of information bits, and/or a sequence of cyclic redundancy check (CRC) bits. The encoded message may be received and decoded (e.g., as described in detail below) as part of a downlink control information (DCI) blind detection procedure.

The receiver may proceed to implement a decoding procedure on the coded data, as described in further detail below in reference to steps 604-614. The decoding procedure may be a successive cancellation list decoding procedure, or any of a variety of other decoding procedures.

At 604, the receiver may begin a decode of the encoded message to produce a subset of the first sequence of bits. The first sequence of bits may be frozen bits of a polar code, so that the decoding procedure begins by decoding a subset of the frozen bits, for example.

The decoded subset of bits may be used (e.g., as described in more detail below in reference to steps 606-610) to verify whether the encoded message was intended for the receiver. In some embodiments, the particular subset of bits that is used in this subsequent ID verification may be selected to balance a reliability and a latency associated with the decoding procedure. For example, in embodiments wherein the encoded message is a polar coded message and the first sequence of bits comprises frozen bits of the polar code, frozen bits that occur later in the decoded message may have a higher reliability than earlier frozen bits, but these later frozen bits will not be decoded until later in the decoding process. The particular subset of frozen bits used for ID verification may be selected to balance the desirable increase in reliability with the undesirable increase in latency associated with later occurring frozen bits of the decoded message.

At 606, the receiver may demodulate the decoded subset of the first sequence of bits with a first pseudorandom sequence (PRS) generated based on a first identifier. For example, the receiver may be a UE that may use a first PRS generated based on the UE's ID to demodulate the decoded subset of frozen bits of a polar coded message. The receiver may generate the first PRS, which may be the same PRS that was previously generated by the transmitter. In these embodiments, the transmitter may have previously scrambled the frozen bits using the same PRS, such that the receiver may unscramble the scrambling mask by demodulating the decoded subset of frozen bits based on the PRS. The PRS may be the same length as the entire frozen bit field, but the demodulation may be performed using the subset of the PRS that corresponds to the decoded subset of frozen bits.

In some embodiments, the first identifier may be a UE group identifier that is a generic identifier of one or more UEs being serviced by a base station.

At 608, the receiver may perform a cross-correlation calculation between the subset of bits that have been decoded and a respective sequence of reference bits. For example, the transmitter and the receiver may be preconfigured to know which values the demodulated frozen bits should have (e.g., the frozen bits may be known by the transmitter and receiver to be a string of zeros or another sequence of values), and these values may be stored as a sequence of reference bits on a memory of the receiver. In these embodiments, a strong cross-correlation between the decoded frozen bits and the respective sequence of reference bits may indicate to the receiver that the demodulation of the frozen bits was performed with the correct UE_ID. In some embodiments, the cross-correlation calculation may involve calculating a divergence of path metrics associated with the subset of decoded frozen bits and the corresponding subset of reference bits.

In some embodiments, the cross-correlation may be performed after demodulating using the PRS, but in other embodiments the sequence of reference bits may be based on the first identifier, and the demodulation step 606 may be skipped. In other words, rather than demodulating the decoded subset of bits based on the first identifier (or based on a PRS generated based on the first identifier), the cross-correlation may be performed with reference bits that are generated based on the first identifier, so that the demodulation is implicitly accomplished through the cross-correlation calculation. The PRS may be the same length as the entire frozen bit field, but the cross-correlation may be performed using the subset of the PRS that corresponds to the decoded subset of frozen bits.

At 610, the receiver may compare the result of the cross-correlation calculation to a correlation threshold. The correlation threshold may be a predetermined degree of correlation, which may or may not vary depending on the number of bits used in the cross-correlation calculation.

At 612, if the result of the cross-correlation calculation is below the predetermined correlation threshold, the receiver may determine that the demasking procedure was unsuccessful (e.g., because the message was intended for a different receiver with a different UE_ID, or a different group of UEs with a different group ID), and the receiver may abort the decoding procedure. In some embodiments, and as described in further detail below, the receiver may maintain a running average calculation of the cross-correlation as more frozen bits are decoded, and the receiver may continue the decoding procedure unless the results of the cross-correlation calculation fall below the predetermined correlation threshold. In some embodiments, after aborting the decoding procedure, the receiver may receive a second encoded message (e.g., it may receive a second polar coded message in a wireless manner from a base station), and the receiver may implement the decoding procedure (e.g., repeating steps 604-610) on the second polar coded message.

At 614, if the result of the cross-correlation calculation is above the predetermined correlation threshold, the receiver may continue the decoding procedure. For example, it may complete the decoding of the first sequence of bits (e.g., the frozen bits) and/or continue to decode the second sequence of bits (e.g., the information bits).

After decoding the second sequence of bits, the receiver may demodulate the second sequence of bits with a second pseudorandom sequence generated based on a second identifier. For example, in the case where the second sequence of bits comprises information bits of a polar code, the information bits may have been scrambled using a second PRS generated based on an identifier unique to the transmitter (e.g., a base station ID). In these embodiments, the receiver may demodulate (e.g., unscramble) the decoded information bits using the same second PRS. The receiver may then store the demodulated second sequence of bits as a decoded message in the memory medium.

In some embodiments, where the first identifier is a UE group identifier, the second identifier may be a UE-specific identifier. In other words, the first identifier may be generically decodable by a group of one or more UEs, while the second identifier may be specific to a particular UE.

When the receiver has finished decoding and demodulating the second sequence of bits (e.g., the information bits), the receiver may perform a cyclic redundancy check (CRC) to determine if an error has occurred during the decoding process. In some embodiments, the cyclic redundancy check may be performed using CRC bits that are appended at the end of the information bits. The CRC bits may have been scrambled using a PRS derived from an identifier that is unique to the intended receiver (e.g., its UE_ID), and the receiver may unscramble the CRC bits using a third PRS generated based on the receiver identifier. Alternatively, the CRC bits may have been scrambled directly with the identifier that is unique to the intended receiver (e.g., its UE_ID), and the receiver may unscramble the CRC bits using the receiver identifier. In these embodiments, multiple layers of identity verification may be employed to mitigate intercell interference and ensure that the receiver receives the intended message. For example, if either of the UE_ID or the CELL_ID used by the receiver to generate respective PRSs is different from the UE_ID or CELL_ID used by the transmitter to modulate the message, the cyclic redundancy check may result in an error and the message may be dropped. If the CRC indicates that an error has occurred, the receiver may determine that the message may have been received from a transmitter with an identifier different from the transmitter identifier used by the receiver. The receiver may then abandon the message and monitor another channel or network resource (e.g., a different control element) to perform blind decoding on a subsequent message.

Explaining this process in further detail, upon receipt of a block whose check bits match that to which the UE is assigned, metrics internal to the decoder will accumulate coherently when using check bit values in place of the corresponding frozen bits. If instead the check bits do not match the values the decoder has determined to use in place of the frozen bits corresponding to the check bits, the metrics will not grow as expected. Based on this observation, this decode instance can be terminated as it presumably does not coincide with the intended DCI encoding.

Polar Codes

Figure 7:
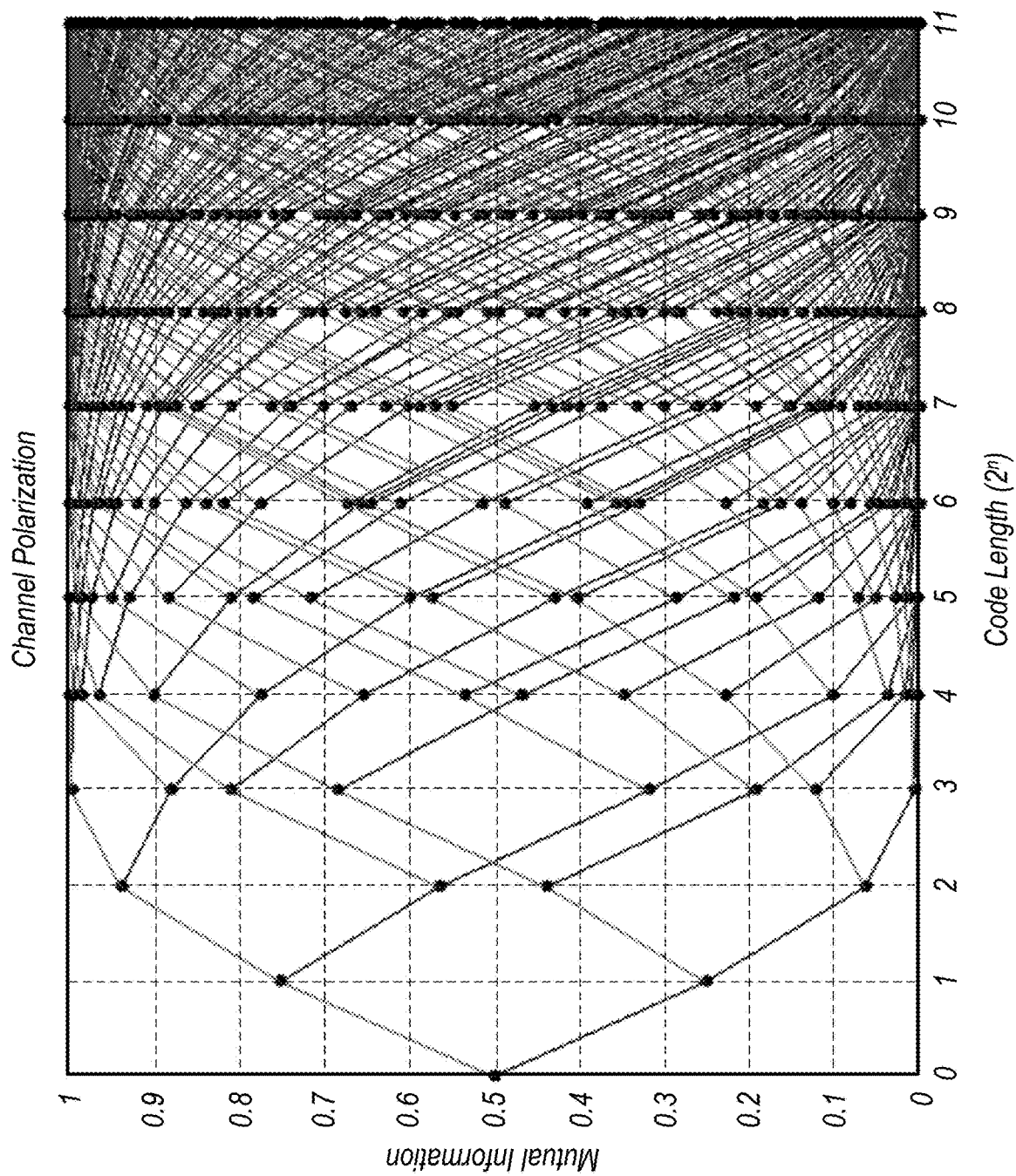
FIG. 7 illustrates an example of channel polarization, where n=11.

This section describes in further detail the function and structure of polar codes, according to various embodiments. A method of constructing capacity achieving codes for the memoryless binary symmetric channel is known in the art. The resulting polar codes leverage a phenomenon known as channel polarization (see FIG. 7) resulting from a recursive process by which the channel capacity, i.e. maximum mutual information, tends toward 1 (fully available) or 0 (unavailable). The corresponding bit probabilities, 1 and 0.5, respectively, approach their limits as the code length, N=2n, increases with positive integer values n. Data may be transferred by placing information on bits on the most reliable channels (these bits may be referred to as information bits) while bits placed on the least reliable channels may be set to a fixed value, e.g. 0 or another known value or set of values. These bits may be referred to as frozen bits. Frozen bits and their mapping to the code matrix may be known by both the transmitter and receiver. As a result, frozen bits may be used as a reference by a decoding algorithm to determine whether an error has occurred from noise in the communication channel, or otherwise. For example, the known value of the frozen bits may be compared to the value determined through the decoding algorithm, to determine whether an error has occurred.

Successive Cancellation Algorithm

The successive cancellation (SC) decoder has been used to demonstrate the viability of the polar coding method. While offering low complexity decoding, the decoder requires long block sizes, approaching a million (i.e. $2^{20}$) bits, in order to compete with rival Turbo or Low Density Parity Check (LDPC) Codes. The successive nature of the SC decoder additionally imposes significant limitations on decoder throughput.

Successive Cancellation List Algorithm

An improved method for decoding polar codes has been established, which is called Successive Cancellation List (SCL) decoding. SCL decoding inspects two possibilities at each decoder phase in parallel: $û_φ=0$ and $û_φ=1$ for each non-frozen bit. The decoder may pursue multiple paths in parallel, retaining the most likely paths at each stage. The encoder may also append a cyclic redundancy check (CRC) that is ultimately used in determining the appropriate bit decision from the available L paths, see Balatsoukas-Stimming et al. in reference 2 above.

Polar Codes

Polar codes form a class of linear block codes described by a generator matrix, G. Polar codes of block lengths N may be generated according to:

$$G = F_N \triangleq (F_2)^{\otimes n} \quad (1)$$

Where $F_N$ denotes the Kronecker product of $$R = \frac{k}{N}$$

among other possibilities.

A polar code is defined by the location of k information bits and (N-k) frozen bits in a block of length, N. The code rate, $$R = \frac{k}{N}$$

is expressed as the ratio of non-frozen bits to the block length. The code rate can be adjusted linearly by varying the number of non-frozen bits per block. Typically, the block length, N, is chosen to be a power of two, such that $N=2^n$, and n is a natural number.

Figure 8:
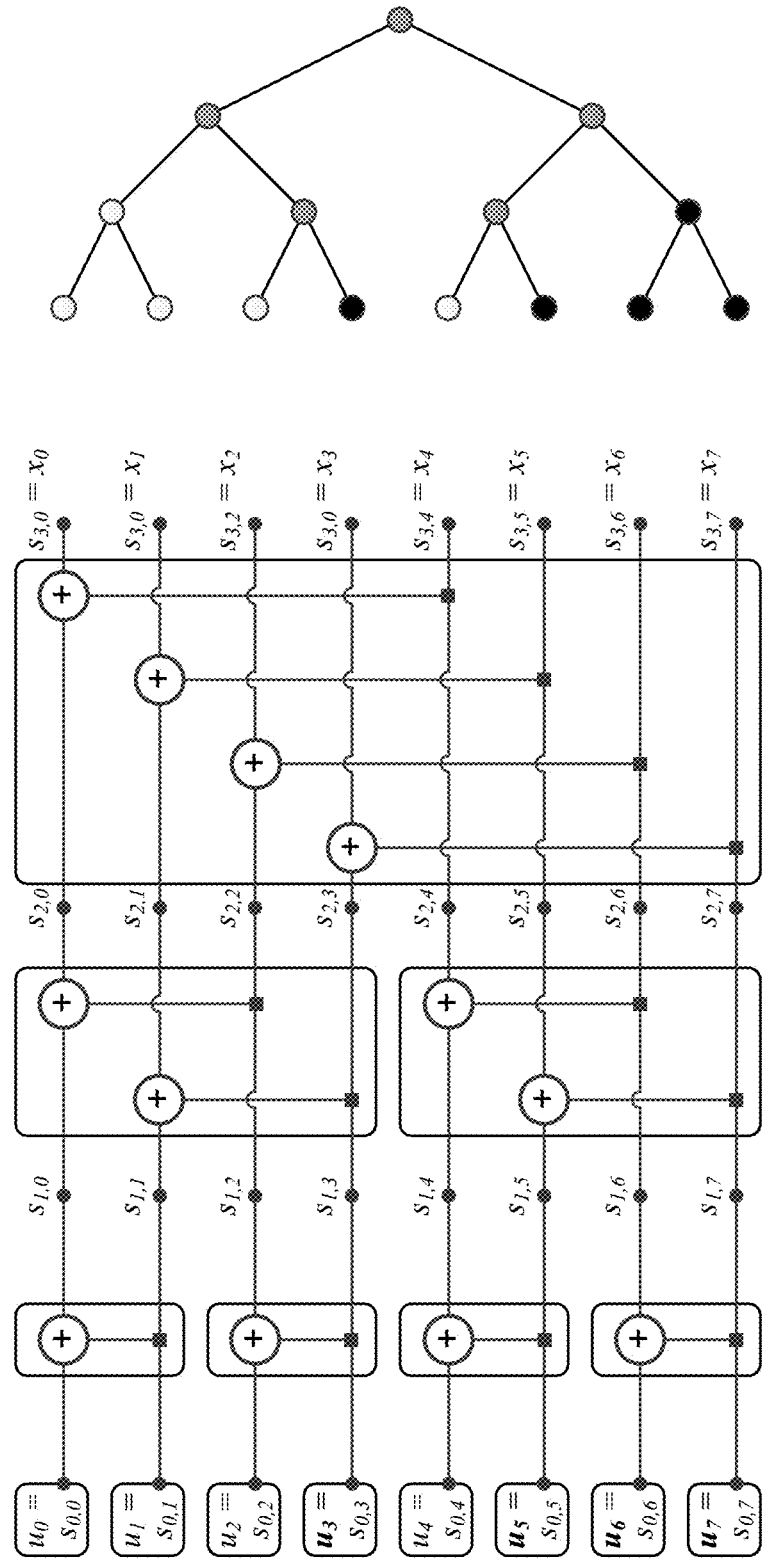
FIG. 8 illustrates an example polar encoder, where n=3.

FIG. 8—Exemplary Polar Encoder

FIG. 8 shows a sample polar code construction for block length $N=2^3$. The encoder begins with inputs, $u_i$, which are encoded into outputs, $x_i$. Information bits are shown in bold. The remaining inputs may be assigned frozen bit values, 0. At each stage, s, the encoder combines pairs of bits according to the encoding tree shown to the right, where $\oplus$ indicates an exclusive-OR (XOR) operation.

SC Decoder

The SCL decoder may be viewed as a collection of SC decoders, each employing independent min-sum calculations on a row of the accumulated log likelihood ratio (LLR) statistics. In some embodiments, an SC decoder may proceed as follows:

At each bit position, i, the SC decoder aims to estimate the bit $u_i$ as follows:

$$\hat{u}_i \triangleq \begin{cases} 0, & \text{if } i \in A_c, \\ 0, & \text{if } \ln\left(\frac{Pr(y, \hat{u}_0^{i-1}) | u_i = 0}{Pr(y, \hat{u}_0^{i-1}) | u_i = 1}\right) \geq 0, \\ 1, & \text{otherwise} \end{cases} \quad (2)$$

where ln $$\left(\frac{Pr(y, \hat{u}_0^{i-1}) | u_i = 0}{Pr(y, \hat{u}_0^{i-1}) | u_i = 1}\right)$$

computes the log likelihood ratio (LLR) at bit position, i, for the estimated information vector, $\hat{u}$, given received symbol, y, and previously decoded bits $\{\hat{u}_0, \hat{u}_1, \ldots, \hat{u}_{i-1}\}$.

Figure 9:
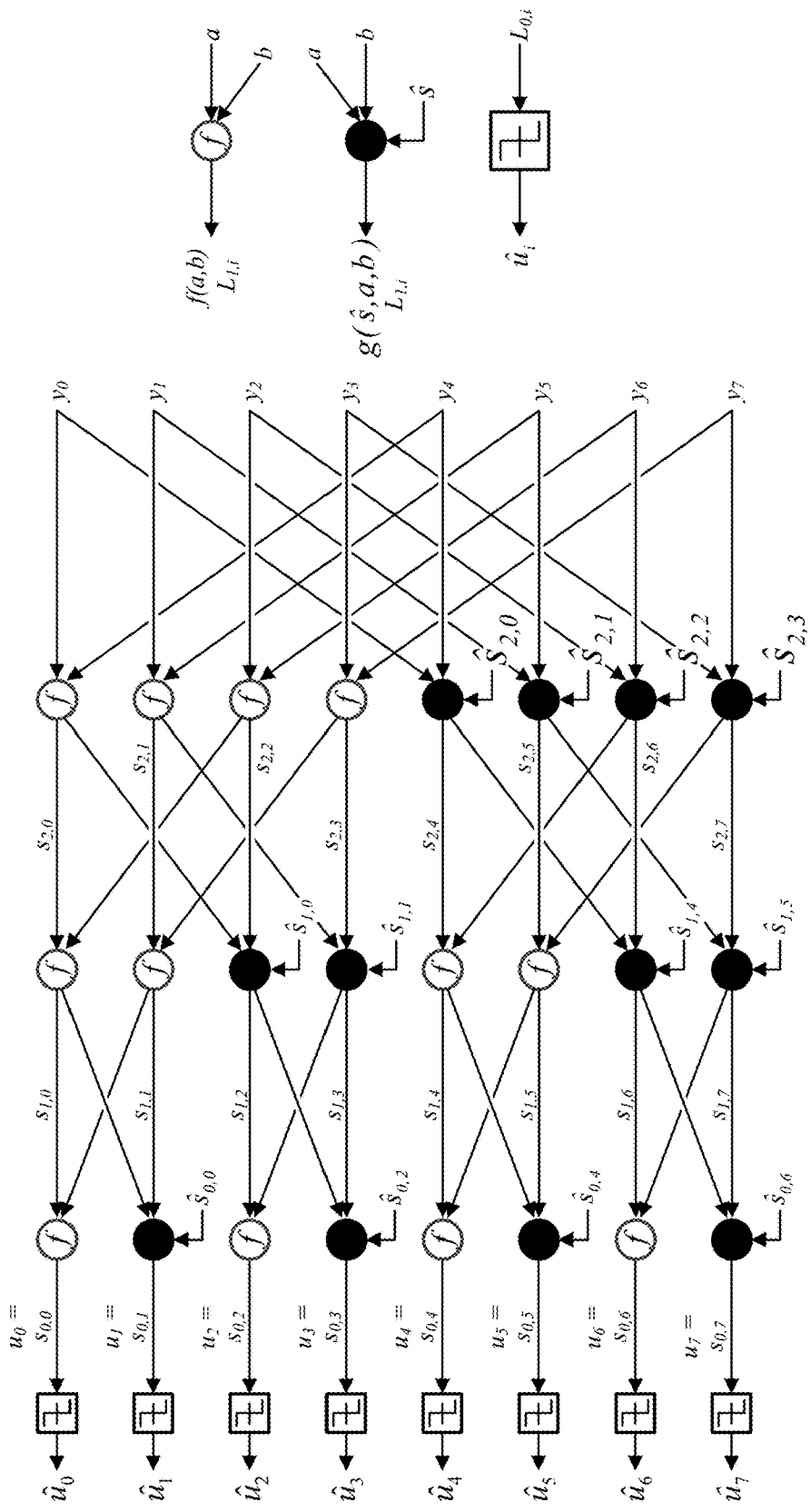
FIG. 9 illustrates an example polar decoder, where n=3.

FIG. 9 shows an example decoder where n=3, so that the block length $N=2^3$.

The decoder algorithm is applied recursively to the multistage diagram illustrated in FIG. 9 according to the following:

$$\lambda_{l,i} \triangleq \begin{cases} \lambda_f(\lambda_{l+1,i}; \lambda_{l+1,i+2}^{n-l-1}), & \text{if } \frac{i}{2^l} \text{ is even} \\ \lambda_g(\hat{s}_{l,z}; \lambda_{l+1,i}; \lambda_{l+1,i+2}^{n-l-1}), & \text{otherwise} \end{cases} \quad (3)$$

Where $\lambda_{l,i}$ denotes the LLR of row i and stage l of the SC decoder graph. The associated kernel calculations constitute the min-sum algorithm:

$$\lambda_f(\lambda_a, \lambda_b) = \text{sgn}(\lambda_a) \cdot \text{sgn}(\lambda_b) \cdot \min(|\lambda_a|, |\lambda_b|) \quad (4)$$

$$\lambda_g(\hat{s}, \lambda_a, \lambda_b) = \lambda_a(-1)^{\hat{s}} + \lambda_b \quad (5)$$

SCL Decoder

A list decoder may depart from the baseline SC decoder with the introduction of a path metric update. At the completion of each bit-decoding stage, path metrics are updated accounting for the possibility of both possible bit values: $\hat{u}_i=0$ and $\hat{u}_i=1$. In some embodiments, a sorting operation may be performed to rank the paths in the list by their likelihood of being a correctly decoded string. The 'tree' of possible paths may then be pruned, retaining only the L most likely paths. The cycle of LLR calculations and path extension and pruning may be repeated for each bit in a transmission block, at which point the most likely path is chosen, revealing the best estimate of the payload data bits.

The SCL decoders described in reference 2 above use the results of the sorting operation to direct multiple memory copies (memcpy), adding processing overhead as the LLR updates cannot resume until the memcpy operations have completed.

DCI Blind Detection

In some embodiments, user identification is based on an assigned C-RNTI (Cell Radio Network Temporary Identifier). Embodiments herein describe methods to discriminate blocks intended for the present user versus those intended for another user early in the course of block decoding. As described in further detail below, a pseudorandom binary sequence (PRBS) may be seeded according to C-RNTI. In other embodiments, the C-RNTI may include group RNTIs, shared RNTIs, and/or RNTIs that may not be explicitly assigned to a particular UE. Such RNTIs may include, but are not limited to, Temporary C-RNTI, SI-RNTI (System Information), P-RNTI (Paging), RA-RNTI (Random Access), TPC-PUCCH-RNTI (Transmit Power Control-Physical Uplink Control CHannel), and TPC-PUSCH-RNTI (Transmit Power Control-Physical Uplink Shared CHannel). Within this document, the terms C-RNTI, RNTI and UE_ID are used to generically represent identification information associated with a single UE or receiver or a group of UEs or receivers, where such UEs are directly or indirectly associated with that identification information. However, it is to be understood that other types of identifiers may also be used according to embodiments described herein.

Some embodiments may employ spread mapping, wherein a large portion, or all of the frozen bits are modulated with a PRBS seeded according to a UE identifier or another identifier. For spread mapping, the PRBS may be longer or even much longer than the UE identifier. Spread mapping may be described in contrast to direct mapping, wherein a PRBS equal in length to the identifier is used to modulate select frozen bit positions, wherein the frozen bit positions may be determined by various means (e.g., the most reliable frozen bit positions, the bit positions corresponding to the highest Hamming weight (largest number of 1s) in the Kronecker matrix, etc.). In some embodiments, spread mapping may overlap the bit positions used in direct mapping, in which case a receiver may choose to monitor select bit positions corresponding to those used for direct mapping in making decisions regarding early termination. Other receiver implementations may instead choose to employ the entire spread mapping in making early termination decisions, where spread mapping refers to frozen bit insertion using a PRBS that is substantially longer than the UE identifier, and direct mapping corresponds to frozen bit insertion using a sequence equal in length to the UE identifier (or potentially using the UE identifier directly).

In some embodiments, cell-specific scrambling is used to mitigate the effects of adjacent cell interference.

In some embodiments, methods described herein may function at signal-to-noise ratios (SNRs) below that for the accompanying shared data channels. Additionally, some embodiments may reduce the false alarm rate (FAR) compared to previous implementations.

Broader Applicability

While embodiments described herein employ UE_ID insertion in polar codes to facilitate early termination on DCI blind detection, in other embodiments, UE_ID insertion may be employed for other uses of polar codes. For example, UE_ID insertion may be employed in polar codes and/or channel coding for mMTC (Massive Machine-Type Communications) applications or URLLC (Ultra-Reliable Low-Latency Communications) applications.

For example, some embodiments may employ techniques described herein for Advanced Driver Assistance Systems (ADAS). In these embodiments, an ID, or representation thereof, delimiting vehicles or groups of vehicles may be embedded in the frozen bit field to enable block discrimination in vehicle-to-vehicle or vehicle-to-infrastructure communications.

Some embodiments may employ techniques described herein for Remote System Monitoring. For example, mMTC may benefit from ID insertion. ID insertion in frozen bits may eliminate the need to separately transmit address information, thereby reducing communication overhead.

While some embodiments embed an identifier (e.g., such as a UE-specific identifier, a UE group identifier, or a base station identifier) in the frozen bits and/or the information bits of a polar code, other embodiments may embed other types of sequences of bits and/or messaging in the frozen bits and/or the information bits. For example, as described in greater detail below, hybrid automatic repeat request (HARM) acknowledgment may be embedded in the frozen bits and/or the information bits of a polar code. Alternatively, other types of reference sequences known to both the transmitter and the receiver may be embedded in frozen bits and/or information bits of a polar code, according to embodiments described herein.

Some embodiments may employ techniques described herein for a broadcast channel. For example, the Physical Broadcast Channel (PBCH) in NR may benefit from carrying CELL_ID and/or a subset of the bits representing the System Frame Number (SFN) and/or the Slot Index (where the Slot Index is an indication of the current position within the current radio frame) in the frozen bits to help distinguish cell and system timing information. The CELL_ID may be inserted into some or all of the frozen bits directly, or the CELL_ID may be used to seed a PRBS that is then inserted into some or all of the frozen bits. Similarly, the SFN-related information may be inserted into some or all of the frozen bits directly, may be used to seed a PRBS that is then inserted into some or all of the frozen bits, or may be used to determine a relative cyclic shift or rotation that is applied to the PRBS contents which are inserted into some or all of the frozen bits.

Some embodiments may employ techniques herein for secure uplink control information (UCI) scrambling. For example, the PRBS may be initialized based on a rolling security code, the schedule of which remains private among a gNB and a UE or group of UEs. In these embodiments, CRC scrambling may prevent final validation of UE_ID on a mismatch. The CRC scrambling may not prevent a rogue listener from attempting to decode the message contents, as a rogue listener may ignore the validity of the final CRC check. In some current implementations (e.g., as defined in LTE), UCI contains no UE_ID scrambling. A rogue user might insert erroneous control channel data, thereby masquerading as a valid user. However, the rogue user may be unaware of the rolling security code, and hence may not be able to appropriately scramble the CRC. In these embodiments, PRBS spread scrambling based on a secure key may inhibit interception from a rogue user.

Some embodiments may employ techniques for improved UL/DL privacy. For example, extending the use of secure scrambling to UL or DL user data communication has the added benefit of assuring the transmitter's identity to similarly mitigate a rogue intercept attack. These embodiments may advantageously ensure privacy close to the physical layer, thereby reducing latency for mMTC or URLLC communication. The frozen bit insertion, including the means of PRBS spreading, may operate similar to that proposed for downlink control information (DCI). In some embodiments, frozen bit insertion may deviate from that proposed for downlink control information (DCI) in the manner in which the PRBS sequence is initialized. For example, rather than initialize sequence generation based on a fixed seed, the seed may rotate according to a shared (e.g. independently shared between the transmitter and receiver), driven schedule key, the update pattern of which may remain private between transmitter and receiver. ADAS or other mission critical communication where rogue interception may prove detrimental may benefit from secure spread scrambling.

Some embodiments may employ techniques described herein for encoding UE_ID on uplink control messages as an added confirmation to the base station (gNB) that the message received in a given set of resources indeed originated from the user to which those resources were allocated. For example, the contents of the PRBS that are inserted into the frozen bits of an uplink control message might be rotated on a schedule known to the UE and gNB as an added security measure.

Some embodiments may employ multiple RNTIs for a particular UE device. In some embodiments, a user may expect DCI messages from multiple DCI formats of the same length, each of which may be associated with different active RNTIs. For example, a Common Search Space (CSS) may employ each of a P-RNTI for paging messages, an SI-RNTI for system information messages, and a TPC-RNTI for group transmit power control. As another example, a UE Specific Search Space (USS) may employ each of a C-RNTI for dynamic scheduling and an SPS-RNTI for semi-persistent scheduling (SPS) activation, deactivation, and/or adaptive hybrid automatic repeat request (HARQ) retransmissions. In these multi-RNTI cases, the UE may distinguish which RNTI is applicable for a given DCI decoding based on RNTI-specific CRC scrambling. In these embodiments, UE_ID frozen bit insertion based on RNTI-specific content may complicate matters, potentially necessitating multiple decode attempts to assess which RNTI is applicable to a given DCI instance. For example, the UE may be required to decode the entire frozen bit field using a specific RNTI and subsequently descramble the CRC before determining whether the DCI message was of the appropriate DCI format associated with the specific RNTI used. This additional decoding may require additional undesirable time and computational resources.

In some embodiments, these undesirable additional decoding procedures may be avoided by defining a multi-RNTI association that assigns at the gNB a multi-RNTI for frozen bit insertion, accompanied by CRC scrambling based on a DCI format-specific RNTI. For example, a given UE may employ a multi-RNTI for decoding the frozen bits, wherein the multi-RNTI is specific to the given UE, but generic to each of the potential DCI formats. The given UE may then perform CRC descrambling based on an RNTI that is specific to a particular DCI format. In these embodiments, the multi-RNTI may be utilized by the UE to determine whether the DCI message was intended for that UE, while the computationally simpler and shorter CRC descrambling procedure may be used with different DCI format-specific RNTIs to determine the DCI format of the DCI message.

In some embodiments, a multi-RNTI may be assigned for use in the frozen bit field to designate association with more than one DCI format-specific RNTI assigned to a given UE. The multi-RNTI may be mapped to the frozen bit field to enable early termination on any RNTIs not belonging to those associated with the multi-RNTI for the present UE. This may be followed by DCI format-specific RNTI CRC descrambling permitting the UE to determine which DCI format was sent.

In various embodiments, the method of assigning the multi-RNTI may take one of two forms.

In one embodiment, a new multi-RNTI may be identified that is separate from the DCI format-specific RNTIs assigned to a given UE.

In another embodiment, the multi-RNTI may be designated from the set of DCI format-specific RNTIs already assigned to the present UE. This may be advantageous in that it does not incur any additional RNTI assignments beyond that already indicated for the anticipated multi-RNTI use cases. A protocol may be used to determine which of the assigned RNTIs to designate as the multi-RNTI. In the case of the Common Search Space (CSS), the TPC-RNTI might be a good candidate given that it is additionally shared across multiple users. For the UE-specific Search Space (USS), C-RNTI may be preferred as it is separate from the SPS-RNTI meant for an individual UE. Other assigned RNTIs, and other multiple DCI formats, are also possible.

A final consideration is how to handle overlapping groups. In some embodiments, two UEs (e.g., $UE_A$ and $UE_B$) may be assigned a group RNTI in addition to their respective UE-specific C-RNTIs. The corresponding multi-RNTI may be associated with, for example, {$C-RNTI_A$, $C-RNTI_B$, plus $G-RNTI_{A,B}$ for group}. The multi-RNTI may be explicitly assigned as a distinct group RNTI or may reuse an existing already-assigned group RNTI such as the TPC-RNTI. For example, a single multi-RNTI may be used to encode the frozen bits for each of a UE-specific message intended for $UE_A$, a UE-specific message intended for $UE_B$, and a group message intended for both $UE_A$ and $UE_B$. After removing the multi-RNTI scrambling, polar decoding may proceed normally. Afterwards, receiver A would proceed to assess CRC masks using each of $C-RNTI_A$ and $G-RNTI_{A,B}$. Meanwhile, receiver B would assess CRC masks using each of $C-RNTI_B$ and $G-RNTI_{A,B}$. While this admits the possibility that one UE may wind up decoding to completion a block intended for the other, the potential for early termination given a single decode attempt per DCI instance outweighs the cost of a UE occasionally decoding a block meant for another user in its group. Meanwhile, the potential for early termination on any DCIs not associated with the multi-RNTI grouping is retained by $UE_A$ and $UE_B$.

In each of the preceding cases listed, customized application may be desirable to initialize the PRBS (or other) spreading, to determine what is an appropriate sequence length, and to determine over what range of frozen bits to map the encoding. Additionally, the extent of frozen bits needed to ensure an accurate ACK/NACK determination may vary across applications. Additionally, UL HARQ ACK/NACK could be signaled on frozen bits of polar encoded downlink control channels.

Candidate Search Spaces

LTE defines a set of Control Channel Element (CCE) locations for a UE to interrogate in search of intended PHY Downlink Control Channel communications (PDCCHs). The set of CCE locations are divided into UE-specific Search Space (USS) and Common Search Spaces (CSS) as indicated in Table 2.

TABLE 2

LTE DCI Search Spaces

| Search Space | Aggregation Level (L) | Size (in CCEs) | No. of PDCCH Candidates | No. of Candidate Blind Decodes |
|---|---|---|---|---|
| USS | 1 | 6 | 6 | 12 |
|  | 2 | 12 | 6 | 12 |
|  | 4 | 8 | 2 | 4 |
|  | 8 | 16 | 2 | 4 |
|  | USS: |  | 16 | 32 |
| CSS | 4 | 16 | 4 | 8 |
|  | 8 | 16 | 2 | 4 |
|  | CSS: |  | 6 | 12 |
|  | Total: |  |  | 44 |

With LTE, each UE may receive 2 DCI formats from USS per Transmission Time Interval (TTI). One reference DCI format, e.g. format 0/1A, is typically expected regardless of the transmission mode configured for the UE. Defined to have the same payload size, the reference DCI formats may require a single decoding attempt per candidate location regardless of the underlying format type. Each UE may require one additional decoding attempt per USS candidate location for one of DCI formats 1, 1B, 1D, 2, 2A, 2B, depending upon the configured transmission mode, every TTI. A UE may then require 16×2=32 blind decoding attempts to monitor all USS candidate locations for two different possible DCI formats per TTI.

DCI formats 0/1A and 3/3A (if TPC-PUCCH-RNTI or TPC-PUSCH-RNTI is configured), specified to have the same payload size, may require one blind decoding attempt per candidate PDCCH location in the CSS. An additional decoding attempt is needed per candidate location in the CSS for DCI format 1C when the UE is required to receive PDCCH scrambled with the SI-RNTI (System Information), P-RNTI (Paging), or RA-RNTI (Random Access), resulting in 6×2=12 blind decoding attempts across the available CSS candidate locations. In total, up to 12+32=44 blind decoding attempts may be required per TTI to monitor both the CSS and USS for the assigned DCI formats. Because each of the up to 44 blind decoding attempt requires considerable time and computational resources, enabling early termination during the blind decoding process may considerably improve the user experience.

Figure 10:
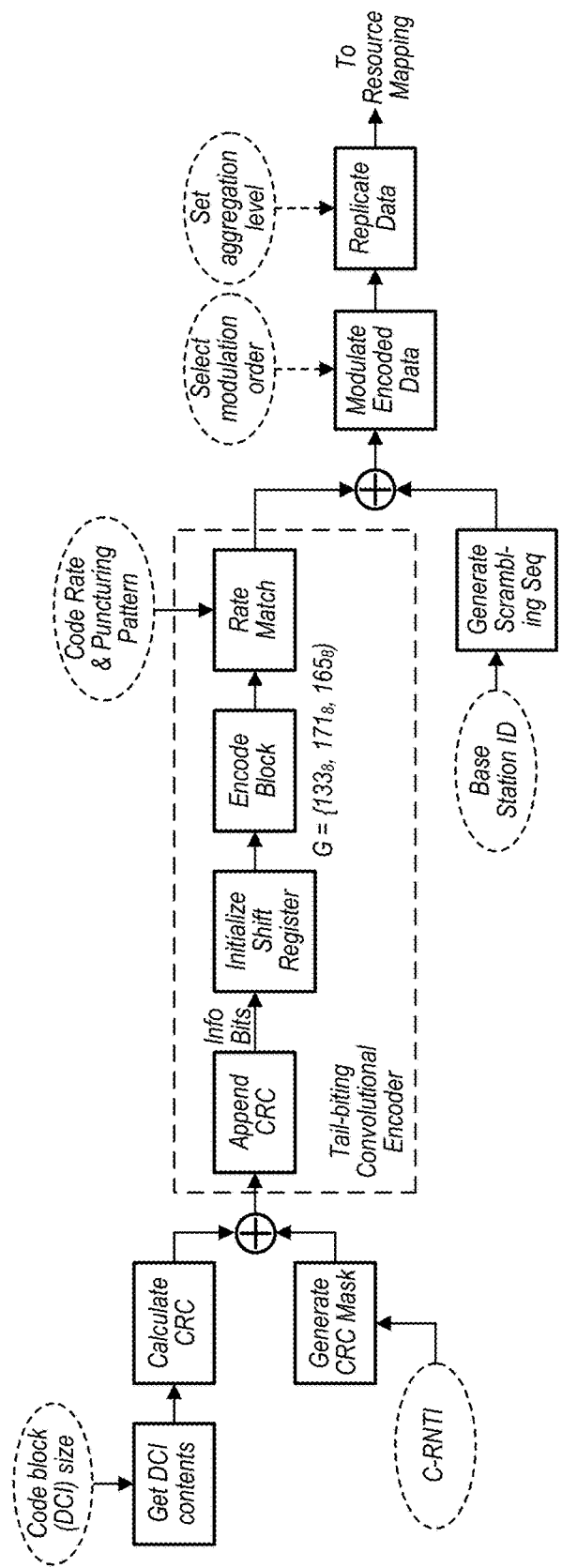
FIG. 10 is a flowchart block diagram illustrating DCI encoding as prescribed for LTE.

FIG. 10—Block Discrimination

FIG. 10 illustrates DCI encoding as prescribed for LTE. LTE employs two methods of block discrimination on DCI detection as depicted in FIG. 10, which may be superimposed on the polar code structure. This methodology for block discrimination may occur in place of the tail-biting convolutional codes used by LTE.

Figure 12:
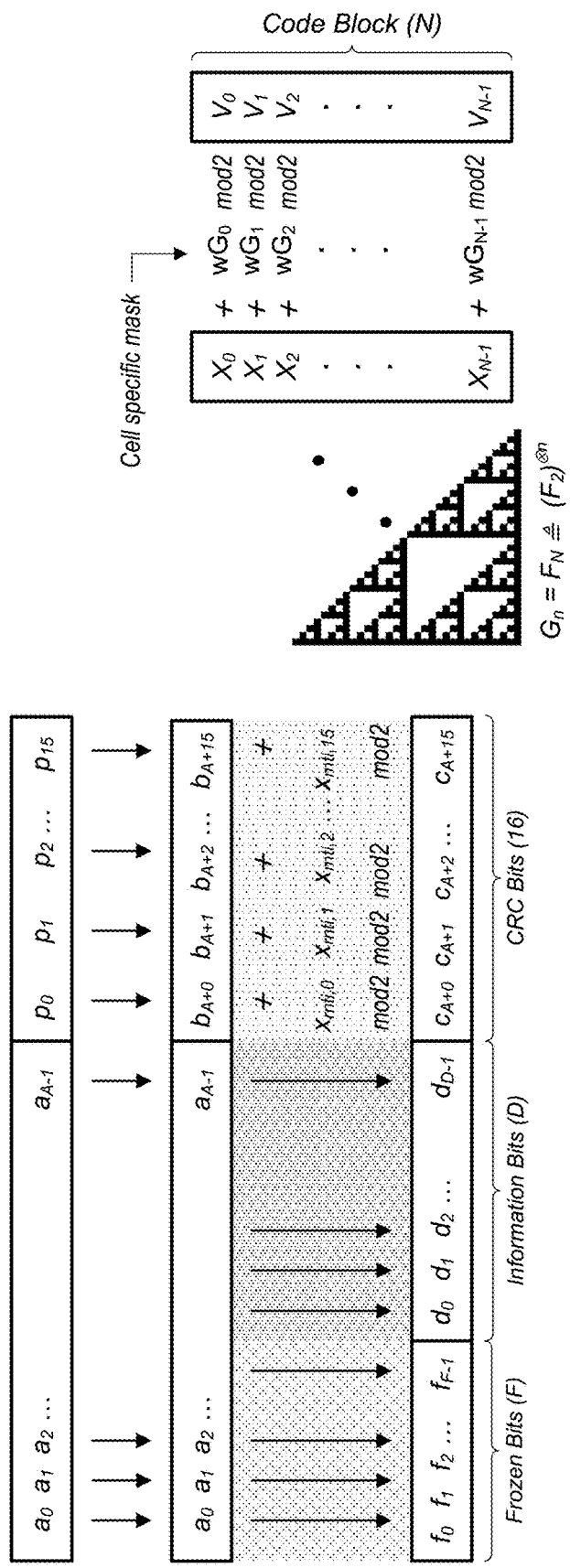
FIG. 12 illustrates bit-mask assignment patterned after that used by LTE, according to some embodiments.

First, a user-specific CRC mask may be applied at the end of each PDCCH to provide block separation based on UE_ID. Second, a cell-specific scrambling mask may be applied at the encoder output to modulate the output message based on CELL_ID, where the encoder is represented in FIG. 12 by an icon of the n-th Kronecker power matrix, Gn.

Polar Code Construction for PDCCH

Taking the underlying polar code structure into account, embodiments described herein perform a multi-mode discrimination mask that can be adapted to a downlink control channel.

The proposed sequence design starts with a conventional Polar Code construction where a code of length $N=2^n$ assigns k information bits (inclusive of CRC and/or Parity Check (PC) bits), $A \subset [N]$, and N-k frozen bits, $F=[N]\backslash A$, the assigned values of which are known a priori to the receiver. The code rate, $R=k/N$, may be determined by the number of user data dependent information bits relative to the block size.

In some embodiments, individual fields of the underlying polar code can be assigned to facilitate block discrimination according to some or all of the following three methodologies.

First, as explained above, a 16-bit CRC may be appended to each PDCCH for error detection. The CRC length of 16 bits is exemplary only and is not intended to be limiting. The CRC length may also be less than or greater than 16 bits. The CRC may be scrambled with a UE-specific mask to enable identification of which PDCCH(s) are intended for a given UE upon interrogating the list of candidate PDCCH locations.

Secondly, as explained above, a UE_ID, or bit values derived from a function of the UE_ID, may be inserted in the frozen bit field to additionally permit a UE to discriminate early in the course of block decoding the PDCCH(s) intended for it from those destined for another user. As a form of early termination, UE_ID insertion is intended to reduce energy that may be expended decoding blocks not meant for the present UE.

Third, as explained above, the information bits may be masked with a cell-specific mask (CELL_ID mask) to mitigate the effects of adjacent-cell interference.

Figure 11:
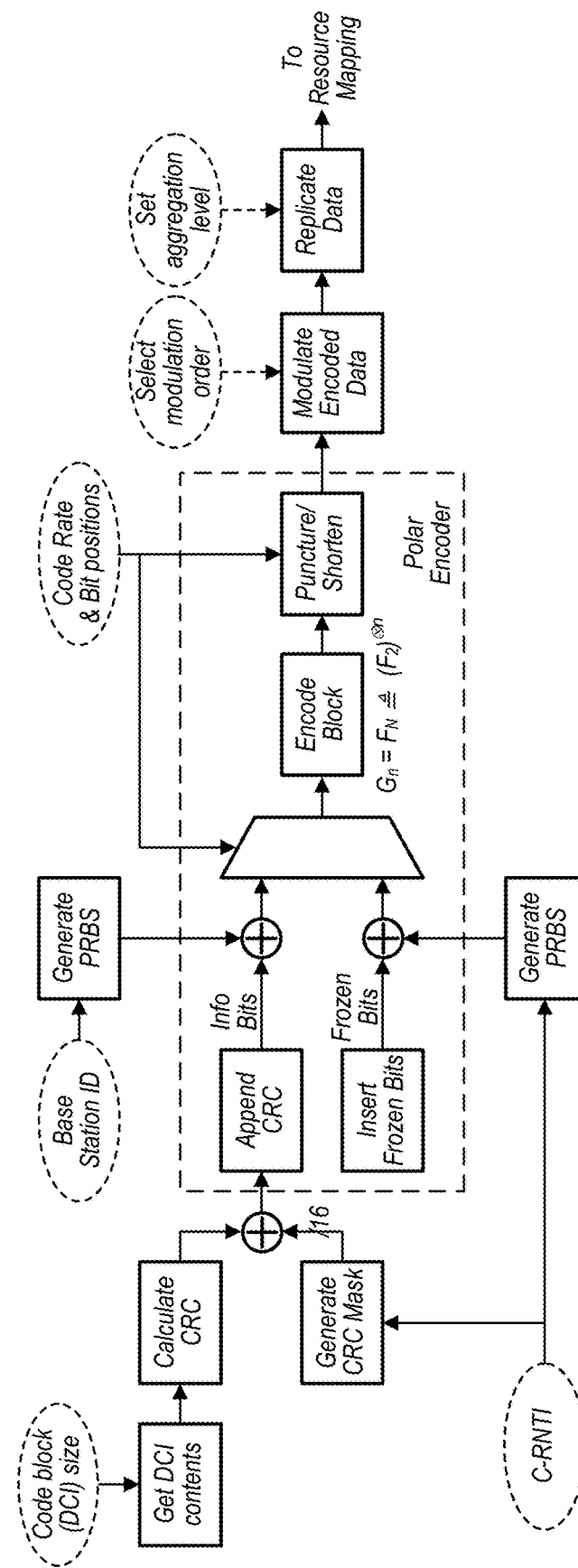
FIG. 11 is a flowchart block diagram illustrating DCI encoding adapted to incorporate polar codes, according to some embodiments.

FIGS. 11-12—Bit Mask Assignment

FIG. 11 illustrates DCI adapted to incorporate polar codes (potentially in NR), according to some embodiments. FIG. 11 illustrates the separate application of bit masks to each of frozen bits, information bits, and CRC bits, respectively, in a polar coded message. As illustrated, the multi-mode mask assignment separately uses different subsets of the bit field for separate identification purposes.

Given a linear transform, application of the Kronecker matrix can be distributed to relate the assigned bit mask(s) to the encoder output:

$$(w+u)G = wG + uG, \qquad (6)$$

Here plus (+) represents a bit-wise XOR of the resulting scrambling mask, wG, computed once per DCI instance, with the original encoder output, uG. The bit masks, $s_{0:F-1}$, $r_{0:D-1}$, $x_{rnti,0:15}$, applied in succession at the encoder input as illustrated in FIG. 12 are equivalent to the scrambling mask, wG, applied at the encoder output, where $0_{0:M-1}$ represents an all-zero vector of length M, and yG=Y reflects the relationship between vectors at the encoder input (lower-case vector y) and output (upper-case vector Y), respectively. The combined mask can be similarly removed at the receiver prior to decoding. Properties assigned to a mask at the encoder input manifest equivalently in a corresponding mask applied at the encoder output. Individual attributes can be assigned so that each mask produces an intended effect as referenced to the construction at the encoder input. The mask contributions may then be combined, encoded, and then applied at the encoder output without loss in effectiveness.

Figure 13:
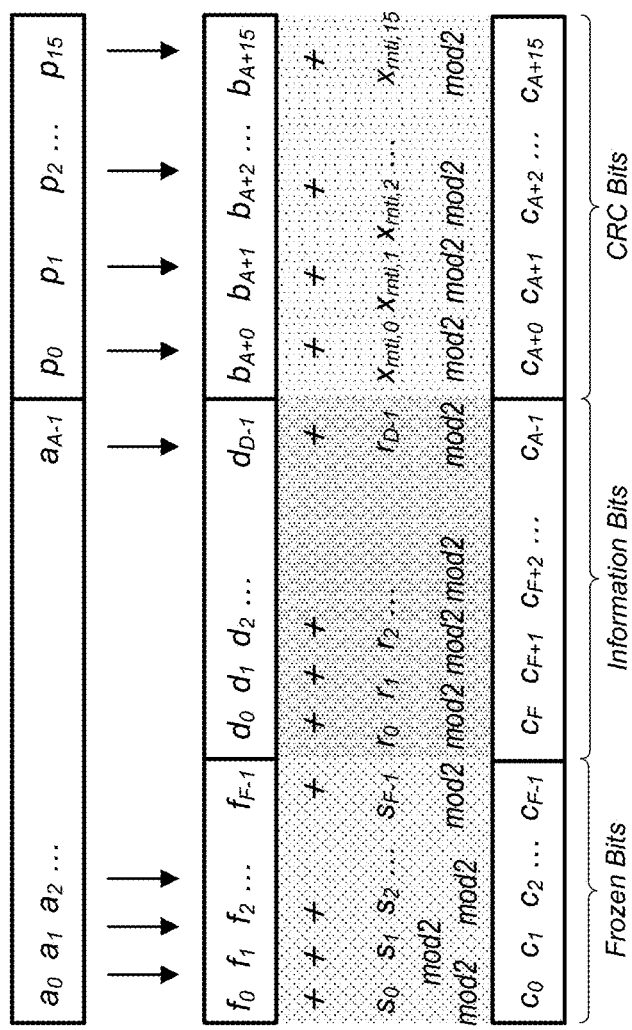
FIG. 13 illustrates a proposed NR bit-mask assignment, according to some embodiments.

FIGS. 13-14: Successive Bit-Mask Assignment

FIGS. 13-14 illustrate bit-mask assignment patterned after that used by LTE, according to some embodiments. In traditional LTE, pseudorandom sequence generation is adapted for a variety of purposes (See reference 3). An exemplary method for generating a pseudorandom sequence is illustrated here to indicate that this method or one similar can be applied to fill the frozen bit contents, the initialization of which is based on the representation of the UE_ID. The method of pseudorandom sequence generation specified by LTE may be adapted to form the frozen bit contents initialized by C-RNTI to facilitate early discrimination with DCI blind detection. In some embodiments, a second application may form the information bit mask initialized on the CELL_ID.

$$c_n = (x_{n+N_c}^{(1)} + x_{n+N_c}^{(2)}) \bmod 2, n=0,1,\ldots,M_{PN}-1 \qquad (7)$$

Here $N_c=1600$ and $M_{PN}$ is determined by the number of affected frozen bits.

Sequences $x_n^1$ and $x_n^2$ may be generated as follows:

$$x_{n+31}^{(1)} = (x_{n+3}^{(1)} + x_n^{(1)}) \bmod 2, n=0,1,\ldots,M_{PN}+N_c-31 \qquad (8)$$

$$x_{n+31}^{(2)} = (x_{n+3}^{(2)} + x_{n+2}^{(2)} + x_{n+1}^{(2)} + x_n^{(2)}) \bmod 2, n=0,1,\ldots,M_{PN}+N_c-31 \qquad (9)$$

Here $x_n^1$ and $x_n^2$ may be initialized as follows:

$$x_0^{(1)}=1, x_n^{(1)}=0, n=1,2,\ldots,30 \qquad (10)$$

$$\sum_0^{30} x_n^{(2)} \cdot 2^n = c_{init} = \left\lfloor \frac{n_s}{2} \right\rfloor \times 2^9 + N_{ID}^{UE} \qquad (11)$$

The frozen bit contents are filled according to: $f_{M+n}=c_n$, where M is the index of the first frozen bit to be used (e.g. the first frozen bit after puncturing has been applied, or the first frozen bit after the first information bit, etc).

Extending the pseudorandom sequence length to the number of available frozen bits (e.g., spread mapping as described above) provides early user separation in a deterministic and reliable manner. If the entirety of the frozen bit contents are populated with the UE_ID-derived pseudorandom sequence, a reliable and efficient means of early block discrimination may be obtained. Similarly, a pseudorandom sequence may be derived from the CELL_ID and applied as a bit mask to the information portion of the block. Additionally or alternatively, the CRC may be masked based on the assigned C-RNTI as is done in LTE. After applying the appropriate zero padding and then summing the masks, their combined effect may be applied in a single scrambling sequence at the encoder output.

While embodiments described above assign a pseudorandom sequence to the full field of available frozen bits, in other embodiments the pseudorandom sequence may be assigned to a subset of the frozen bits, e.g. starting with the first frozen bit after puncturing, or starting with the first frozen bit following the first information bit. The frozen bit assignment may be suspended after some number of information bits has been consumed, e.g. once the remaining workload has exceeded some minimum threshold of energy savings. These particular subsets of frozen bits are exemplary only and are not intended to be limiting, as assigning a pseudorandom sequence to other subsets of the frozen bit field is also possible.

In some embodiments, the pseudorandom sequence may be the same length as the UE_ID or the CELL_ID, resulting in direct mapping. In some embodiments, a combination of spread mapping and direct mapping may be employed for a single transmission. In these embodiments, the frozen bit positions selected in direct mapping may be a subset of the bit positions selected with spread mapping. In other words, the frozen bits selected for spread mapping may be a superset of those selected for direct mapping, which may allow the relevant bits decoded from the spread mapping procedure to be passed on for processing in a direct mapping algorithm. In other words, spread mapping may be employed without interfering with the functionality of direct mapping within the spread mapping frozen bit field. While some embodiments may afford spread mapping a performance advantage relative to direct mapping, it may additionally provide a receiver manufacturer the latitude to include only the bit positions they deem desirable in making an early termination decision, based, for example, on maximum Hamming distance or bit reliability.

Figure 15:
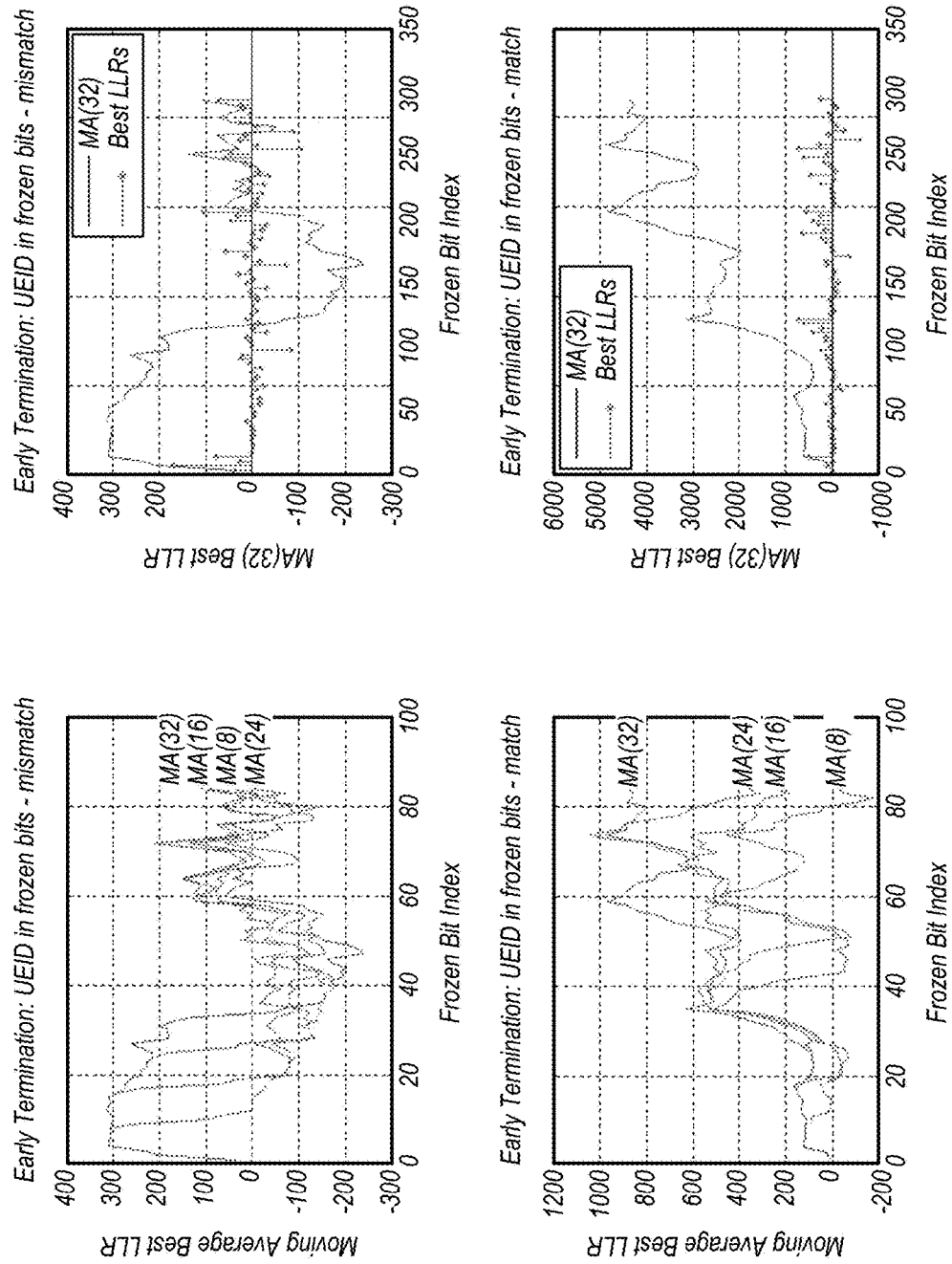
FIG. 15 illustrates data using a moving average to obtain early block discrimination for a mismatch (top) and match (bottom), according to some embodiments.

FIG. 15—Early Block Discrimination Based on UE_ID Frozen Bit Assignment

FIG. 15 illustrates data for an early termination procedure of frozen bit decoding, for the case of both a match and a mismatch between the encoding and decoding UE_ID.

Given a UE_ID derived frozen bit assignment, early block discrimination may amount to Maximum Likelihood (ML) sequence detection. A match in the asserted frozen bit position yields a positive accumulation, while a mismatch yields a negative accumulation. A predominance of positive accumulation as seen by a moving average (MA) provides a reliable means to discriminate those blocks meant for the current user from those meant for another user. This tendency persists even at low SNR, as shown in FIG. 15.

For the purposes of block discrimination, the best LLRs are taken to be the set seen at each bit position as belonging to the best path, i.e. the path exhibiting the smallest path metric. There is no assertion that the perceived best path during the course of block decoding will survive as the remaining best path. However, indication of the perceived best path may prove useful in deriving metrics to facilitate early discrimination.

As illustrated in FIG. 15, a moving average of the best LLRs exhibits an increasing trend upon match in frozen bit assignment and trends downward when there is a mismatch in expected bit assignment. Referring again to FIG. 15, the top two plots correspond to a mismatch in frozen bit assignment between encoder and decoder. As expected, the accumulated LLRs exhibit a sharp downward trend as the number of negative matches begins to accumulate. The onset of this downturn is a function of the length of the applied moving average. It occurs earlier with a shorter moving average and later with a longer moving average.

Examining a match in encoder/decoder frozen bit assignment, we observe that the LLR accumulation is largely positive. This observation is again a function of the length of the applied moving average. As illustrated in the bottom two plots of FIG. 15, a relatively short moving average, e.g. MA[8], MA[16], is susceptible to short-lived fluctuations rendering the metric less reliable for block discrimination. Ultimately, a tradeoff can be found in MA size that balances power savings due to early block discrimination and the reliability of the mechanism used to make that determination.

Figure 16:
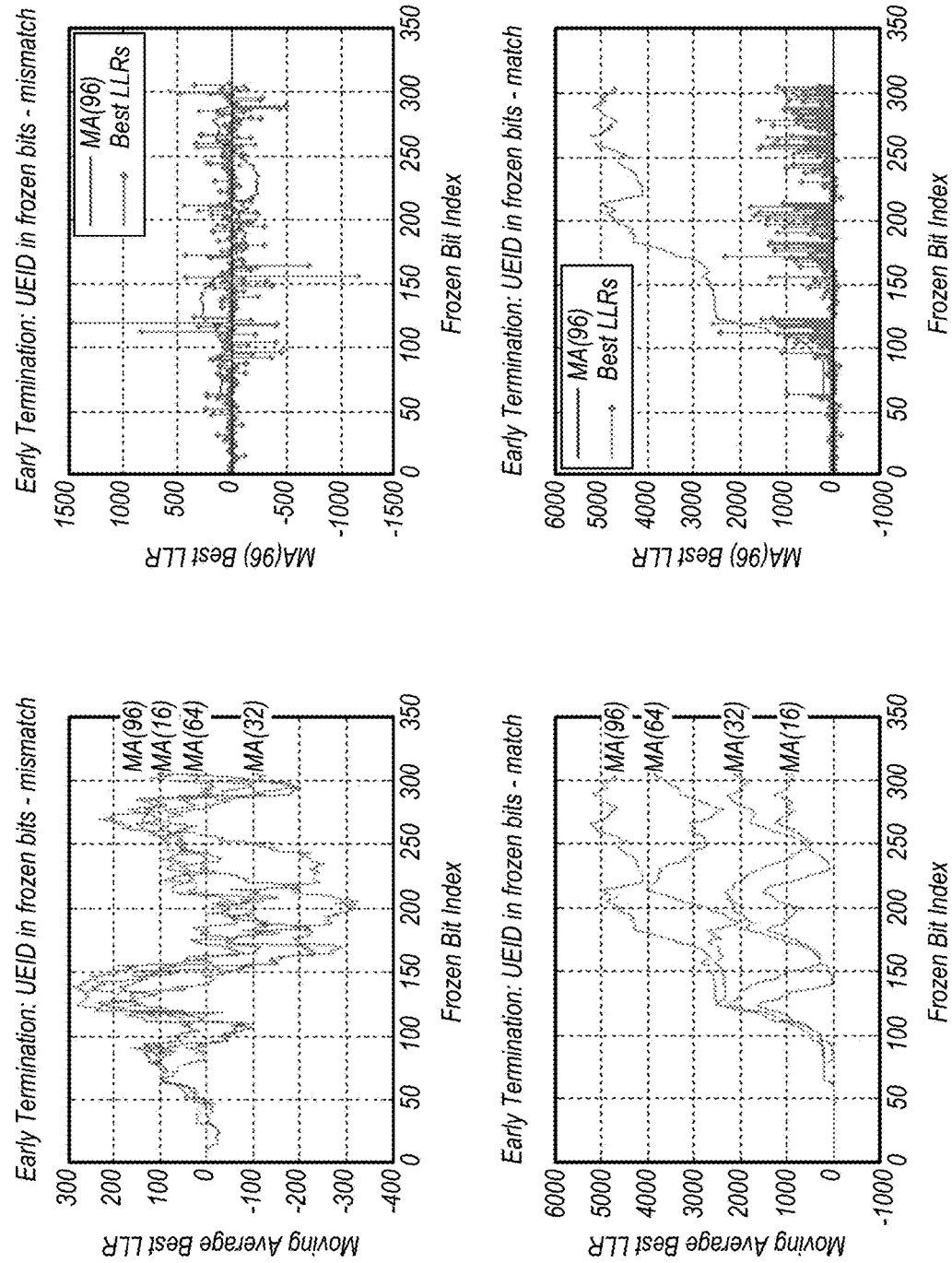
FIG. 16 illustrates additional data using a moving average to obtain early block discrimination for a mismatch (top) and match (bottom), according to some embodiments.

FIG. 16—Effect of Bit Feedback on Match Identification

FIG. 16 illustrates the effect of erroneous feedback on the match identification procedure. A mismatch in frozen bit assignment has a secondary effect related to expected decoder operation. The SC and SCL decoders are characterized by a succession off and g-operators. While the f-operator depends solely on input LLRs, the g-operator output is conditioned on the preceding bit estimates:

$$f(a,b) = \text{minsum}(a,b); \qquad (12)$$

$$g(\hat{s}, a, b) = \begin{matrix} b-a, & \hat{s}=1 \\ b+a, & \text{else} \end{matrix} \qquad (13)$$

If a portion of the previously estimated bits, fed back in the form of partial sums to the g-operator, is in error due to a mismatch in frozen bit assignment, the downstream LLRs may be affected as well in a manner that is incremental to disturbance due to the channel itself. The data in FIG. 16 is taken at relatively high SNR, and as illustrated the LLRs in the bottom right-hand plot predominantly trend in the positive direction whereas those in the upper right-hand plot show the disruptive effects of the channel coupled with erroneous feedback in the g-operator. Erroneous feedback in the g-operator propagates to downstream bit decoding, frozen and info bits alike, further reducing FAR should an unintended PDCCH elude early termination and make its way to a final CRC check. In particular, the effects of frozen bit mismatch persist even in the event that the scrambling mask is removed prior to the start of decoding.

Figure 17:
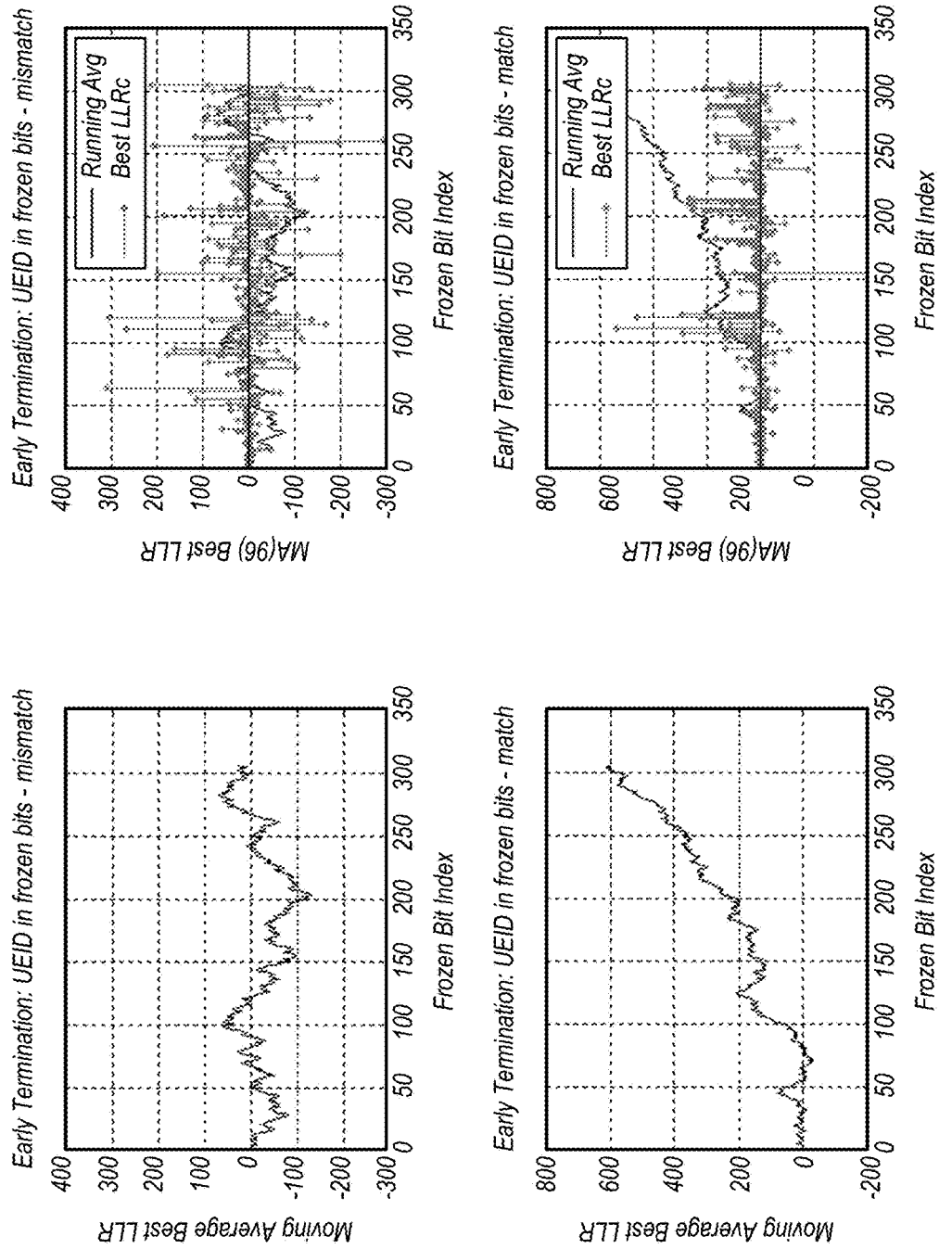
FIG. 17 illustrates data using a running average to obtain early block discrimination for a mismatch (top) and match (bottom), according to some embodiments.

FIG. 17—Combined Effects of Sequence Mismatch and Error Propagation

FIG. 17 illustrates how the combined effects of sequence mismatch and error propagation due to g-operator feedback give rise to heuristics that might prove useful for early block discrimination.

In the illustrated embodiment of FIG. 17, Maximum Likelihood sequence detection aims to determine a match versus mismatch in the frozen bit contents by studying the LLRs (Log Likelihood Ratios) at the decoder output. After descrambling a match scenario, it is observed that the output LLRs trend mostly in the positive direction, indicative of a presumed all-zero bit-field. The resulting LLR accumulation may exhibit a mostly positive slope, again evidence that the scrambling sequence was correctly removed, thereby returning all zeros to the frozen bit field, additive noise effects notwithstanding (See FIG. 17—bottom two plots). Conversely, a random distribution in sign values might indicate a mismatch in frozen-bit assignment at the receiver as compared to that embedded at the gNB. The accumulated LLRs will exhibit a slope that fluctuates between positive and negative reflecting a potential mismatch in bit assignment (See FIG. 17—top two plots).

The liability with LLR accumulation stems from placement of the frozen bits predominantly in the least reliable bit positions. The resulting LLR accumulation is prone to significant fluctuation regardless of whether the encoding represents a match or a mismatch, thus rendering direct sequence detection unusable as a metric for early termination.

Figure 18:
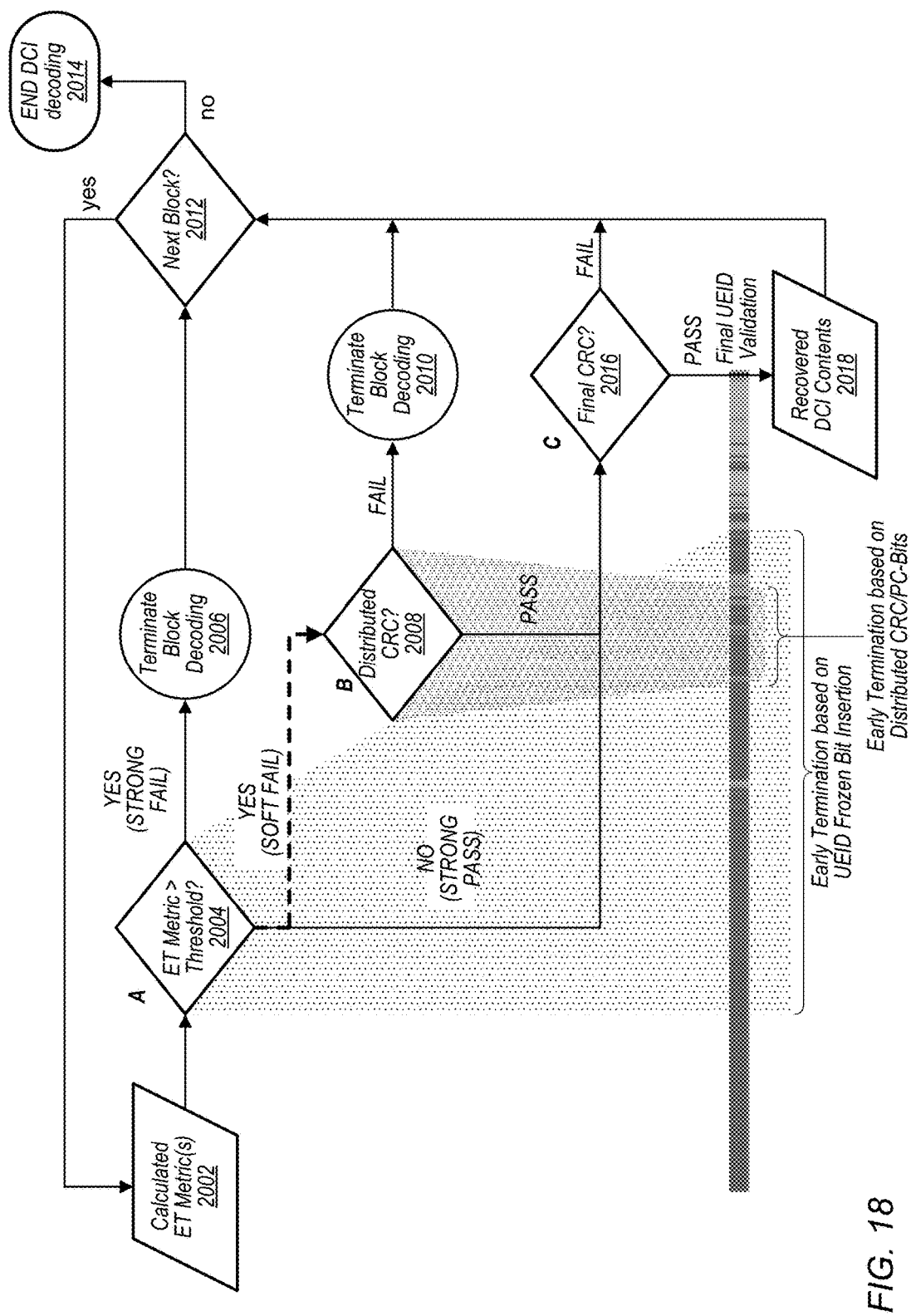
FIG. 18 is a flowchart illustrating tiered UE identification, according to some embodiments.

FIG. 18—Flowchart of Tiered UE Identification

FIG. 18 is a flowchart diagram illustrating tiered UE identification, according to some embodiments. In some embodiments, a receiver may take a tiered approach in performing block discrimination, whereby the receiver determines whether a received message is encoded based on a UE_ID that is a match or a mismatch of the receiver's UE_ID. Alternatively, block discrimination may be performed based on one or more of a base station ID or a group ID. Block discrimination may comprise determining a match/mismatch in a decoded UE_ID, where a soft fail with regard to one early termination criterion may be subjected in turn to evaluation with regard to a second criterion, potentially followed by a third. In FIG. 18, the timeline marked with sparsely dotted shading indicates the availability of ET metrics comprised within frozen bits (used for a first determination of match/mismatch), and the more densely dotted shading indicates the location of distributed cyclic redundancy check (CRC) within information bits of a polar code (used for a secondary determination of match/mismatch). A final CRC check appended at the end of the information bits may be used as a third criterion for determining match/mismatch.

In a tiered approach to determining match/mismatch on DCI detection, it may be desirable to provide a non-binary measure (i.e., a measure that may assume more than two values) of an early termination metric, in some embodiments. A non-binary measure may also be beneficial in distinguishing two encodings of different lengths, which differ in the frozen bit positions but otherwise convey the same UE_ID, in which case the relative magnitudes of a non-binary measure evaluated for each of the two different encodings may help in distinguishing which of the two decode attempts is best suited to be carried through to examination of the distributed cyclic redundancy check (CRC) or final CRC bits.

In some embodiments, a non-binary measure is one that assigns a level of confidence to a match/mismatch determination of UE_ID decoding regarding the decision to terminate the decoding process based on evaluation of an early termination metric. The non-binary measure may range from a strong pass (indicating a very likely match), to a soft fail (indicating moderate violation relative to a prescribed threshold), to a strong fail (indicating a significant violation relative to a prescribed threshold). The non-binary measure may be used to indicate instances where proceeding to assess the distributed CRC bits to determine match/mismatch may be warranted in spite of a (binary) violation relative to the prescribed early termination threshold.

In some embodiments, the non-binary measure may be derived as follows.

First, during the decoding process, a record may be made of any observations of an early termination metric that violate a matching threshold. Each decoded bit position at which the early termination (ET) metric is computed may constitute an instance where an observation may be made (i.e., where the ET metric is compared to a threshold).

In some embodiments, the number of observations of ET metrics that violate the matching threshold may be counted, and a non-binary measure of ET metric violation may be determined based on the number of violations, and a strong fail may be determined to occur at some maximum allowable count. The specific ET metric used may be one of a variety of types as described above. In general, a violation may result when the decoded frozen bit is inconsistent (i.e., presents a mismatch) with a reference bit known to the receiver. In other embodiments, a ratio may be computed of the number of observations that violate the matching threshold to the running count of total observations. In these embodiments, the non-binary measure may be determined based on the ratio. This non-binary metric may be used to augment a strict threshold assessment, especially in the case of a tiered approach to determining match/mismatch in UE_ID.

In some embodiments, a value of the non-binary measure may be computed between zero and one, where zero indicates a perfect match and one indicates a perfect mismatch. For example, the non-binary measure may be normalized such that its value will be between zero and one. In some embodiments, the non-binary measure may be quantized (i.e., the exact computed value may be quantized to a discreet set of three or more values). For example, in some embodiments, the computed value may be quantized to one of three different values. In these embodiments, a computed value sufficiently close to zero (e.g. within a predetermined threshold away from zero) may be rounded down to (i.e., quantized to) zero, indicating a strong pass. Values close to zero but further than the predetermined threshold may be quantized to an intermediate value, indicating modest violation (i.e., a soft fail) suggesting the need to consult the distributed CRC bits for further evidence of the need to terminate. Third, a value sufficiently close (e.g., within a second predetermined threshold) or equal to one may be rounded up to one to indicate significant violation, providing strong evidence to terminate (i.e., a strong fail). In other words, the range of values from 0 to 1 may be divided into three ranges as follows: A value between 0 and x, where x is greater than 0 and less than 1, may be determined to be a strong pass. A value between x and y, where y is greater than x but less than 1, may be determined to be a soft fail. A value between y and 1 may be determined to be a strong fail. The specific values of x and y may be determined based on a variety of factors. For example, by adjusting the range of values that result in a determination of strong pass, soft fail, and strong fail, they may be empirically or theoretically determined to provide a desirable balance between decreasing the latency, as well as decreasing the incidence of false positives and false negatives, of the decoding process.

In other embodiments, the non-binary measure may be quantized into a larger number of categories (e.g., four or more), resulting in a block discrimination approach with a larger number of tiers.

In some embodiments, insertion of a UE_ID into frozen bits may provide the first means of block discrimination. As illustrated in FIG. 18, a determination of a strong fail according to the ET metric may result in a termination of block decoding, without proceeding to subsequent decoding steps. A strong pass may indicate an observed metric that remains well-behaved with respect to a prescribed threshold (A) up to the availability of the distributed CRC (B). Given this indication, in some embodiments, a receiver may choose to bypass the CRC based on the distributed CRC bits, thereby avoiding added latency and energy consumption, relying instead on the final CRC to assess the validity of the UE_ID at decision point (C). On the other hand, a soft fail, corresponding to a non-binary metric that is intermediate between a strong fail and a strong pass (i.e. that has a minimal excursion above the ET metric threshold or an excursion above the threshold in a few isolated bit positions), may warrant further validation based on the distributed CRC at decision point (B) before electing to terminate.

In some embodiments, performing a CRC parity check based on the distributed CRC bits at 2008 may provide a second means to validate a presumed UE_ID. If the UE_ID insertion threshold has not been violated to this point, a CRC failure may still result in early block termination based on the distributed CRC bits. Given a limited number of available bit positions, distributed CRC may be effective in eliminating only a portion of the potential block assignments, a subset of which may decode identically on a potential match. If the CRC based on the distributed CRC bits is determined to fail, the block decoding process may terminate. When the block decoding terminates, the method may continue to determine if a subsequent block should be decoded, in which case the method may restart with a new decoding process for the subsequent block. If no further blocks are available for decoding, the downlink control information (DCI) decoding process may end. Conversely, if a pass is determined, the decoding process may continue to decode the information bits of the polar coded message, and final CRC bits may be checked for final validation that the receiver is the intended recipient of the polar coded message.

In some embodiments, a final CRC appended to the information bit-field with each block encoding provides the final validation of user/group ID. The final CRC check may not afford any energy savings, as it occurs at the conclusion of the block decoding process. In the event of a final CRC failure, the UE may determine that a block mismatch has occurred. In other words, the final CRC may provide a final check to verify that the block is not a mismatch.

Handling of Multiple RNTIs for DCI Frozen Bit Scrambling

The following paragraphs describe specific implementation details for handling multiple RNTIs for DCI frozen bit scrambling, according to some embodiments.

In LTE, a UE may need to search for (blind decode) DCIs whose CRC is scrambled based on one or more of the following RNTI values. There are two areas for a UE to search in the PDCCH region: the Common Search Space (CSS) and the UE-Specific Search Space (USS). Depending upon a particular subframe's configuration, the CSS and USS may represent distinct separate search spaces or may partly or fully overlap with each other. Although the equivalent functionality in 3GPP 5G NR has not yet been fully defined, it is expected to be somewhat similar to the corresponding functionality in LTE.

The following paragraphs describe a variety of RNTI types, and their corresponding DCI locations in the CSS and/or the USS.

SI-RNTI (System Information)—DCI 1A & 1C in the CSS

P-RNTI (Paging)—DCI 1A & 1C in the CSS

RA-RNTI (Random Access)—DCI 1A & 1C in the CSS

Temporary C-RNTI—DCI 0/1A in the CSS (DCI 0 and DCI 1A have the same bit lengths as each other—an internal flag in the payload may be used to determine whether a successfully decoded DCI candidate is a DCI 0 or a DCI 1A), and DCI 1 & 1A in the USS C-RNTI—DCI 0/1A in the CSS, DCI 0/1A and one of DCI {1, 1B, 1D, 2, 2A, 2B} (depending upon the configured transmission mode) in the USS. In some embodiments, an active UE may always be configured with a C-RNTI.

SPS C-RNTI (Semi-Persistent Scheduling)—DCI 0/1A in the CSS, and DCI 0/1A and one of DCI {1, 2, 2A, 2B} (e.g., depending upon the configured transmission mode) in the USS. In some embodiments, an active UE may optionally be configured with an SPS C-RNTI. For example, not all active UEs need be configured with an SPS C-RNTI.

TPC-PUCCH-RNTI (Transmit Power Control for PUCCH)—DCI 3/3A in the CSS. Note that DCI 3/3A has the same bit length as DCI 0/1A. An active UE may optionally be configured with TPC-PUCCH-RNTI for power control purposes.

TPC-PUSCH-RNTI (Transmit Power Control for PUSCH)—DCI 3/3A in the CSS. Note that DCI 3/3A has the same bit length as DCI 0/1A. An active UE may optionally be configured with TPC-PUSCH-RNTI for power control purposes.

TABLE 3

DCI Formats

| DCI Format | Purpose | Number of bits including CRC (for a system bandwidth of 50 resource blocks and 4 antennas at the gNB) |
|---|---|---|
| 0 | PUSCH grants | 42 |
| 1 | PDSCH assignments with a single codeword | 47 |
| 1A | PDSCH assignments using a compact format | 42 |
| 1B | PDSCH assignments for rank-1 transmission | 46 |
| 1C | PDSCH assignments using a very compact format | 26 |
| 1D | PDSCH assignments for multi-user MIMO | 46 |
| 2 | PDSCH assignments for closed-loop MIMO operation | 62 |
| 2A | PDSCH assignments for open-loop MIMO operation | 58 |
| 3 | Transmit Power Control (TPC) commands for multiple users for PUCCH and PUSCH with 2-bit power adjustments | 42 |
| 3A | Transmit Power Control (TPC) commands for multiple users for PUCCH and PUSCH with 1-bit power adjustments | 42 |

Table 3 above lists candidate DCI formats in LTE for a system bandwidth of 50 resource blocks and 4 antennas at the base station, according to some embodiments. As can be seen, DCIs 0, 1A, 3, and 3A all have the same bit length, while all other DCIs have unique bit lengths. An internal flag in the payload may be used to determine whether a successfully decoded DCI candidate for a given RNTI is a DCI 0 or a DCI 1A. A particular DCI 0/1A may be scrambled with one of several different RNTI values, and a UE may determine the context of that DCI 0/1A by determining upon which RNTI the scrambling was based. DCI 3 or 3A may be distinguished from a DCI 0/1A via the RNTI value that may be used for scrambling as shown in the above list of DCIs. Note also that a particular cell is configured to use either DCI 3 or DCI 3A (but not both) for supplemental power control purposes—that is, DCI 3 and DCI 3A are mutually exclusive.

RNTI Categories

According to some embodiments, the different RNTIs described above may be categorized into three different types: Broadcast RNTIs, Group RNTIs, and Individual RNTIs. New additional RNTIs may be introduced in 5G NR, but these may be able to be assigned to one of these three categories described below.

Broadcast RNTIs

Broadcast RNTIs may be associated with transmissions that could be conceivably directed towards any UE within a cell. Broadcast RNTIs may be found in the CSS. Broadcast RNTIs may include SI-RNTI, P-RNTI, RA-RNTI, and Temporary C-RNTI, among other possibilities. Broadcast RNTIs may not be searched for all of the time, but rather only when certain tasks are being performed (e.g., while a UE is acquiring system information, checking for paging messages, or performing random access, among other possibilities). Accordingly, there may be less potential for power saving via early termination when broadcast RNTIs are involved. However, DCIs associated with a broadcast RNTI may be present in the CSS, and it may be desirable for a UE that is searching for DCIs associated with a nonbroadcast RNTI to be able to perform early termination when blind decoding a candidate DCI space to which a DCI associated with a broadcast RNTI has been mapped.

Group RNTIs

Group RNTIs may be associated with transmissions that are directed towards a subset or group of UEs within a cell. Group RNTIs may be found in the CSS. Group RNTIs may include TPC-PUCCH-RNTI and TPC-PUSCH-RNTI, among other possibilities. Group RNTIs (when configured) may typically be searched for by a UE in every active subframe.

Individual RNTIs

Individual RNTIs may be associated with transmissions that are directed towards a particular UE within a cell. Individual RNTIs may be found in the CSS or USS, depending on the exact DCI format. Individual RNTIs may include C-RNTI and SPS C-RNTI, among other possibilities. Individual RNTIs (when configured) may typically be searched for in every active subframe.

DCI Candidate Categories

In some embodiments, two categories of overlapping DCI candidates may be described, with different RNTIs to consider as follows.

Category 1:

DCI 0/1A/3/3A (all the same length) in the CSS with broadcast, group, or individual RNTIs.

A first solution for Category 1, which we refer to herein as Solution 1-A, may be described as follows. DCIs (e.g. DCI 1A, 1C) in the CSS using a broadcast RNTI (e.g. SI-RNTI, P-RNTI, RA-RNTI, Temporary C-RNTI) may have their frozen bits scrambled with an all-zero sequence or with a fixed known sequence, regardless of which RNTI is in use. The CRC may be scrambled based on the appropriate broadcast RNTI for differentiation purposes. Note that DCI 1C may be used only with a broadcast RNTI.

DCIs (e.g. DCI 3 or 3A) in the CSS using a group RNTI (e.g. TPC-PUCCH-RNTI, TPC-PUSCH-RNTI) may be scrambled in one of three ways according to Solution 1-A, according to various embodiments.

In one embodiment (Solution 1-A-i), such DCIs may have their frozen bits scrambled with an all-zero sequence or with a fixed known sequence. The CRC may be scrambled based on the appropriate group RNTI for final UE identification.

In another embodiment (Solution 1-A-ii), a TPC-PUCCH group may be defined as the group of UEs sharing a particular TPC-PUCCH-RNTI. A TPC-PUSCH group may be defined as the group of UEs sharing a particular TPC-PUSCH-RNTI. For this particular option, each UE configured with a group RNTI within the cell may be required to satisfy one of the following conditions: The UE may be required to be configured with a TPC-PUCCH-RNTI but not with a TPC-PUSCH-RNTI and all other UEs within that UE's TPC-PUCCH group must also not be configured with a TPC-PUSCH-RNTI, the UE may be required to be configured with a TPC-PUSCH-RNTI but not with a TPC-PUCCH-RNTI and all other UEs within that UE's TPC-PUSCH group must also not be configured with a TPC-PUCCH-RNTI, or the UE may be required to be configured with both a TPC-PUCCH-RNTI and a TPC-PUSCH-RNTI and the members of that UE's TPC-PUCCH and TPC-PUSCH groups must be identical.

When a UE has been configured with a TPC-PUSCH-RNTI, then the DCI's frozen bits may be scrambled based on that TPC-PUSCH-RNTI and the CRC may be scrambled based on the TPC-PUSCH-RNTI or TPC-PUCCH-RNTI (if configured) as appropriate. When a UE has been configured with a TPC-PUCCH-RNTI but not with a TPC-PUSCH-RNTI, then the DCI's frozen bits and CRC may be scrambled based on that TPC-PUCCH-RNTI.

In yet another embodiment (Solution 1-A-iii), the frozen bits and CRC of a DCI 3 or 3A associated with a TPC-PUCCH-RNTI may be scrambled based on that TPC-PUCCH-RNTI. The frozen bits and CRC of a DCI 3 or 3A associated with a TPC-PUSCH-RNTI are scrambled based on that TPC-PUSCH-RNTI. Note that this solution may increase the number of blind decodes to be performed by a UE since separate blind decodes may need to be performed for each of a UE's TPC-PUCCH-RNTI and TPC-PUSCH-RNTI (if both RNTIs are configured). However, this may remove the requirement that the members of a UE's TPC-PUCCH group and TPC-PUSCH group need to be identical.

DCIs (e.g. DCI 0/1A) in the CSS using an individual RNTI (e.g. C-RNTI, SPS C-RNTI) may be scrambled as follows. When the corresponding UE has not been configured with any group RNTI (neither TPC-PUCCH-RNTI nor TPC-PUSCH-RNTI), then the DCI's frozen bits may be scrambled based on the UE's C-RNTI and the CRC may be scrambled based on the UE's C-RNTI or SPS C-RNTI, as appropriate.

When the corresponding UE has been configured with a TPC-PUSCH-RNTI, then the DCI's frozen bits are scrambled based on that TPC-PUSCH-RNTI and the CRC is scrambled based on the UE's C-RNTI or SPS C-RNTI as appropriate.

When the corresponding UE has not been configured with a TPC-PUSCH-RNTI but has been configured with a TPC-PUCCH-RNTI, then the DCI's frozen bits may be scrambled based on that TPC-PUCCH-RNTI and the CRC may be scrambled based on the UE's C-RNTI or SPS C-RNTI as appropriate.

A second solution for Category 1, referred to herein as Solution 1-B, may be described as follows. Any DCI located in the CSS may have its frozen bits scrambled with an all-zero sequence or with a fixed known sequence, regardless of which RNTI is associated with that DCI. The CRC of each such DCI may be scrambled based on the appropriate broadcast, group, or individual RNTI. This may ensure that only one blind decoding per candidate DCI format and candidate location will be performed, at the expense of not being able to perform early termination for any DCI candidate located in the CSS.

Frozen bit scrambling based on a specific RNTI value (rather than with an all-zero sequence or fixed known sequence) may be used only for DCIs located strictly in the USS for Solution 1-B, thereby enabling early termination only for DCI candidates located strictly in the USS.

A second category of DCI candidates may be divided into two subcategories, Category 2, Parts A and B.

Category 2 (Part A):

DCI 0/1A and one of DCI {1, 2, 2A, 2B} in the USS with multiple individual RNTIs (i.e. UE has been configured with both a C-RNTI and an SPS C-RNTI). Note that only individual RNTIs are typically used in the USS. Broadcast and group RNTIs are generally not used in the USS.

In some embodiments, Category 2, Part A may be addressed as follows. A UE configured with an SPS C-RNTI may necessarily also have a C-RNTI. The frozen bits of any UE-specific DCI in the USS may be scrambled based on the UE's C-RNTI. The CRC of such a DCI may be scrambled based on the UE's C-RNTI or SPS C-RNTI as appropriate.

When there are overlapping candidate search spaces between the CSS and USS, the gNB may treat any DCI 0/1A which is associated with an individual RNTI and which falls into such an overlapping candidate search space as being located in the CSS rather than in the USS. (In an alternate embodiment, the gNB may treat such a DCI 0/1A as being located in the USS rather than in the CSS.)

Category 2 (Part B):

UE-specific DCI candidates (DCI 0/1A and one of DCI {1, 2, 2A, 2B}) in the USS with a single individual RNTI (i.e. UE has been configured with only a C-RNTI and does not have an SPS C-RNTI). This may also include the case of one of DCI {1B, 1D} in the USS even when the UE has been configured with an SPS C-RNTI, since those particular DCI formats are used only with the C-RNTI and not with the SPS C-RNTI.

In some embodiments, Category 2, Part B may be addressed as follows. The frozen bits of any UE-specific DCI in the USS may be scrambled based on the UE's C-RNTI, and the CRC of such a DCI may be scrambled based on the UE's C-RNTI.

When there are overlapping candidate search spaces between the CSS and USS, the gNB may treat any DCI 0/1A which is associated with an individual RNTI (C-RNTI) and which falls into such an overlapping candidate search space as being located in the CSS rather than in the USS. (In an alternate embodiment, the gNB may treat such a DCI 0/1A as being located in the USS rather than in the CSS.)

For example, C-RNTI+0 and C-RNTI+1 may be used to initialize PRS spreading for frozen bit insertion on blocks of length0, length1, . . . , respectively. Meanwhile, CRC scrambling may retain use of the assigned C-RNTI.

In some embodiments, one-to-many mapping may be utilized, whereby assigning a Broadcast RNTI in the frozen bit-field may facilitate search of the CSS with final block discrimination based on the RNTI-specific CRC mask. These embodiments, may provide the means to discriminate UE-specific encodings as well as any vacant search space candidates. The Group RNTI may provide the means to distinguish respective sub-groups occupying a shared search space. The ability to address multiple non-overlapping sub-groups while preserving the benefits of early termination may prove beneficial for NR, for example.

In some embodiments utilizing one-to-many mapping, assigning the Group RNTI to equal the Broadcast RNTI may reduce the required decode attempts in the CSS. Additionally, assigning distinct Group RNTIs may provide the means to address non-overlapping sub-groups separately, i.e. $Group_i$, $Group_j$, $Group_k$, . . . etc.

In some embodiments, many-to-one mapping may be utilized, whereby the Multi-RNTI is introduced to eliminate the need for multiple decode attempts in the case where a UE

TABLE 4

RNTI Mapping

| RNTI Classification | Intended RNTI-UE Mapping | RNTI(s) + NR TBD | DCI Formats | Search Space | Codeword Scrambling | | |
|---|---|---|---|---|---|---|---|
| | | | | | Frozen Bit-field | Info Bit-field | CRC |
| Individual | one-to-one | C-RNTI | 0/1A | CSS | PRS (C-RNTI) | PRS (CELL_ID, Slot Index) | RNTI |
| | | | 0/1A & {1, 1B, 1D, 2, 2A, 2B} | USS | | | |
| | | SPS C-RNTI | 0/1A | CSS | | | |
| | | | 0/1A & {1, 2, 2A, 2B} | USS | | | |
| Broadcast | one-to-many (ALL) | SI-RNTI | 1A & 1C | CSS | PRS (BCAST-RNTI) | PRS (CELL_ID, Slot Index) | RNTI |
| | | P-RNTI | 1A & 1C | CSS | | | |
| | | RA-RNTI | 1A & 1C | CSS | | | |
| | | Temporary C-RNTI | 0/1A | CSS | | | |
| | | | 1 & 1A | USS | | | |
| Group | one-to-many (some) | TPC-PUCCH-RNTI | 3/3A | CSS | PRS (GROUP-RNTI) | PRS (CELL_ID, Slot Index) | RNTI |
| | | TPC-PUSCH-RNTI | 3/3A | CSS | | | |
| Multi | many-to-one | GROUP/BCAST-RNTI + INDIV-RNTI | Combos as defined above | Combos as defined above | PRS (GROUP/BCAST-RNTI) | PRS (CELL_ID, Slot Index) | INDIV-RNTI |
| Vacant | none-to-any | AWGN | — | — | NONE | NONE | NONE |

In some embodiments, codeword scrambling may take into account a range of RNTI mappings as summarized in Table 4. The proposed mapping may enable multiple modes of block discrimination.

For example, in some embodiments, one-to-one mapping may be utilized, whereby spreading an assigned C-RNTI in the frozen bit-field may provide the means to discriminate blocks not intended for the present user, including any vacancies (i.e. AWGN) encountered in the candidate search space. The frozen bit mapping may additionally enable early termination on decode attempts representing a mismatch in expected DCI size/code rate. In these embodiments, the information bit scrambling may lead to a CRC failure even in the event that the correct RNTI as assigned, albeit in an adjacent cell. The CRC mask may provide the means to verify the received RNTI, i.e. C-RNTI or SPS-RNTI.

In some embodiments utilizing one-to-one mapping, separate RNTIs may help discriminate blocks of different lengths and/or code rates that are intended for the same UE.

is anticipating more than one DCI type in a given subframe (e.g., see Reference 3 incorporated by reference, above). The individual RNTI may be used in the CRC mask for final DCI verification.

In some embodiments, no mapping may be utilized (i.e. vacant mapping). In these embodiments, similar to a mismatch in UE_ID, AWGN in a candidate search space may result in a mismatch in the descrambled frozen bit contents providing the potential for early termination. The CRC mask may provide final discrimination upon encountering a vacancy in the candidate search space.

Encoding HARQ ACK/NACK in Polar Codes

Some embodiments may employ techniques described herein for Hybrid Automatic Repeat reQuest (HARQ) applications. In these embodiments, the downlink (DL) and/or uplink (UL) HARQ acknowledgment/negative acknowledgment ACK/NACK messaging on the Downlink Control Information (DCI) and/or Uplink Control Information (UCI) channel may be carried through the frozen bits if polar codes are selected (for example, for URLLC or other applications). Though the specific implementation details are as yet undecided for NR, URLLC by definition is expected to require high reliability and low latency. This may present an advantageous opportunity for ACK/NACK insertion in frozen bits. For example, DL HARQ on a control channel may be signaled in a similar manner in instances where ACK/NACK is carried explicitly on the control channel as opposed to piggybacking on a data channel communication. The same code spreading mechanism described above may be applied except, in the case of DL HARQ, the spreading may represent a robust encoding of one or more ACK/NACK bit(s). For example, spread mapping may be performed on the ACK/NACK bit(s) by modulating the ACK/NACK bit(s) with a pseudorandom sequence to obtain a PRBS that is the same length as the extent of the frozen bit field. In some embodiments, the spreading may be combined with block coding to encode multiple ACK/NACK bits. Early determination of ACK/NACK in the frozen bits may result in lower latency at the gNB in activating the HARQ process.

In some embodiments reliability may be increased by signaling information such as DL/UL HARQ ACK/NACK on both frozen and information bits in a polar encoded control channel. Assessment of the frozen bit metric relative to a threshold may indicate whether there is high confidence in initiating the HARQ process or in waiting to complete decoding of the ACK/NACK in the information bits.

Embodiments described herein may employ DCI Early Termination in a manner that is compatible with HARQ functionality. For example, the inherent scalability of UE_ID insertion with SNR makes UE_ID insertion with spread mapping advantageously suited for use with HARQ retransmission on DCI. A particular UE (e.g., UE 106A, or $UE_A$) may operate at a low SNR, and may likely require retransmission of messages intended for that UE. For $UE_A$, the gains of early termination may be reduced since the UE will still have to await retransmission to successfully receive the message.

Retransmission may then serve to improve the likelihood of correct decoding by $UE_A$. However, the surrounding users, especially those at higher SNR (e.g., other users may be in closer proximity to the gNB), may benefit from the potential to terminate the original transmission and any retransmissions meant for $UE_A$. On an individual basis, $UE_A$ may continue to attempt to decode the intended DCI with each subsequent retransmission. From a cell-wide perspective, the surrounding UEs may aim to terminate any blocks meant for another user regardless of whether or not those blocks constitute a retransmission. Energy savings in the surrounding UEs may depend in part on their ability to disregard any and all blocks sent to $UE_A$, inclusive of any retransmissions. In these embodiments, early termination of retransmissions not meant for one of the surrounding UEs may result in significant energy savings for these surrounding UEs.

Figure 19:
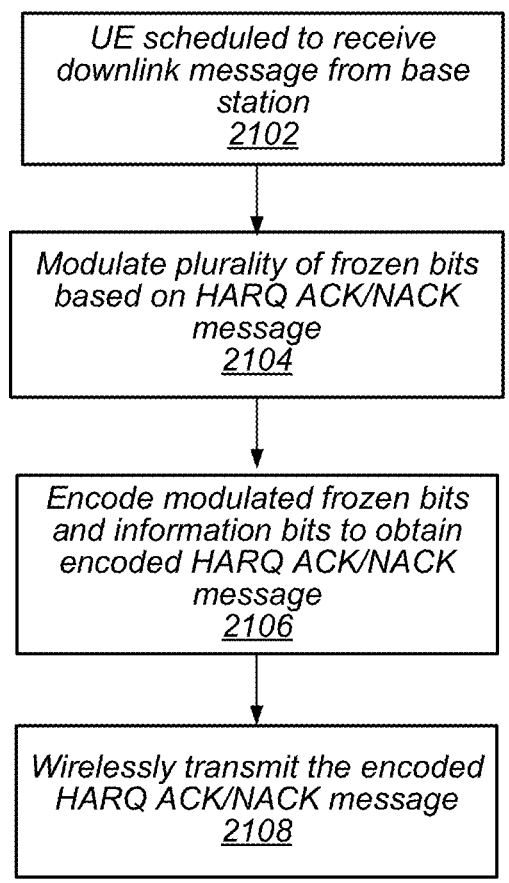
FIG. 19 is a flowchart diagram illustrating a method for inserting HARQ ACK/NACK messaging in frozen bits and/or information bits of a polar code, according to some embodiments.

FIG. 19—Flowchart of HARQ ACK/NACK Insertion in Polar Codes

FIG. 19 is a flowchart diagram illustrating a method for inserting HARQ ACK/NACK messaging in frozen bits and/or information bits of a polar code, according to some embodiments. The method shown in FIG. 19 may be used in conjunction with any of the systems or devices shown in the above Figures, among other devices. In various embodiments, some of the method elements shown may be performed concurrently, in a different order than shown, or may be omitted. Additional method elements may also be performed as desired. As shown, this method may operate as follows.

At 2102, a user equipment (UE) may determine whether a downlink message was successfully received from a base station. For example, the UE may have previously sent a request for a downlink message to the base station, and/or may have been previously scheduled to receive the downlink message from a base station, and the UE may monitor a particular radio resource at a particular time for the downlink message. Subsequent to receiving the downlink message, the UE may decode the message and determine whether the message was successfully received, or whether a retransmission of the message may be desirable. Depending on whether the downlink message is successfully received, unsuccessfully received, or not received at all, the UE may desire to transmit a hybrid automatic repeat request (HARQ) acknowledgement or negative acknowledgment message to the base station.

At 2104, based on the determination whether the downlink message was successfully received, the UE may modulate a plurality of frozen bits of a polar code based on a HARQ acknowledgement message to produce a plurality of modulated frozen bits. The HARQ acknowledgement message may be either a positive acknowledgment message (ACK) or a negative acknowledgment message (NACK). For example, if the UE successfully received the downlink message, the UE may modulate the plurality of frozen bits based on a HARQ ACK message, whereas if the UE did not successfully receive the downlink message, the UE may modulate the plurality of frozen bits based on a HARQ NACK message.

In some embodiments, said modulating the plurality of frozen bits with the HARQ acknowledgment message may involve performing spread mapping on the HARQ acknowledgment message to obtain a pseudorandom binary sequence that has the same length as the frozen bits. The UE may then modulate the plurality of frozen bits with the pseudorandom binary sequence. Because the extent of the frozen bit field of the polar code may be substantially longer than the extent of the ACK/NACK message, spread mapping may introduce a large degree of redundancy in the encoded ACK/NACK message. Because frozen bits are less reliable than information bits in polar codes, this redundancy may assist the base station in successfully decoding the frozen bits, while still enabling the base station to decode the ACK/NACK message earlier than if the ACK/NACK message was encoded only in the information bits.

In some embodiments, the information bits of the polar code may be alternatively or additionally modulated based on the HARQ ACK/NACK message based on the determination whether the downlink message was successfully received. For example, the information bits may be utilized for a secondary encoding of the HARQ ACK/NACK message. In the event that the base station was unable to successfully decode the HARQ ACK/NACK message encoded within the frozen bits (e.g., if the encoded message is transmitted through sufficiently poor radio conditions), the information bits may be utilized for a secondary decoding of the HARQ ACK/NACK message.

In some embodiments, performing spread mapping may be combined with block coding to encode multiple ACK/NACK bits. For example, it may be desirable for a UE to transmit multiple ACK/NACK bits associated with multiple messages and/or multiple parts of messages that the UE was scheduled to receive from the base station.

At 2106, the UE may encode, using a polar code, the plurality of modulated frozen bits and a plurality of information bits to obtain an encoded HARQ ACK/NACK message.

At 2108, the UE may wirelessly transmit the encoded HARQ ACK/NACK message to the base station. In some embodiments, the encoded HARQ ACK/NACK message is transmitted in association with an Ultra-Reliable Low-Latency communications (URLLC) service. In some embodiments, the encoded HARQ ACK/NACK message may be wirelessly transmitted using a radio resource that has been previously scheduled by the base station. For example, earlier communications between the base station and the UE may have scheduled a particular radio resource (e.g., a particular time and/or frequency resource) for the UE to transmit uplink ACK/NACK messaging, and the wireless transmission may be performed utilizing this radio resource.

Figure 20:
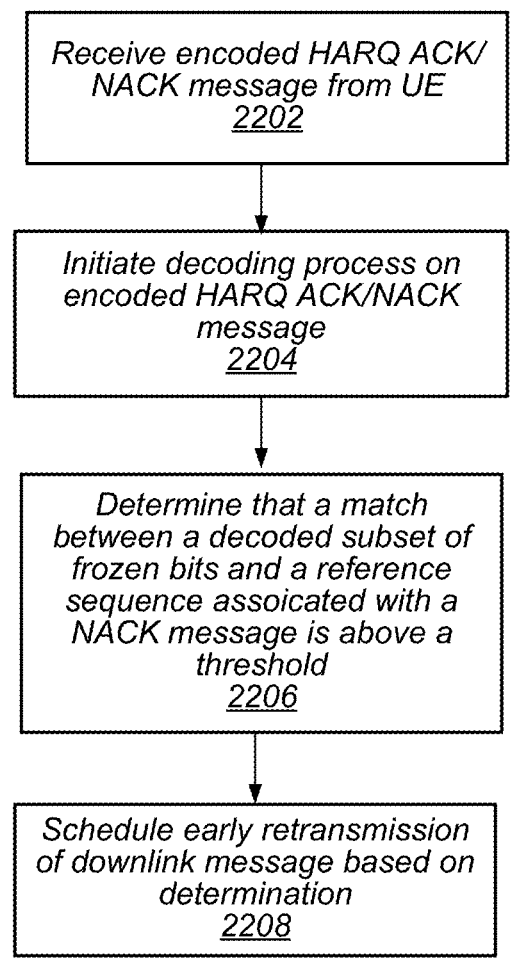
FIG. 20 is a flowchart diagram illustrating a continuation from the receiver side of the method described in association with FIG. 19.

FIG. 20—Continued Flowchart for Polar Coded HARQ Messaging

FIG. 20 is a flowchart diagram illustrating a continuation from the receiver side of the method described in association with FIG. 19. For example, the method described in FIG. 20 may be initiated subsequent to completion of step 2108 of FIG. 19. The method shown in FIG. 19 may be used in conjunction with any of the systems or devices shown in the above Figures, among other devices. In various embodiments, some of the method elements shown may be performed concurrently, in a different order than shown, or may be omitted. Additional method elements may also be performed as desired. As shown, this method may operate as follows.

At 2202, a base station may receive an encoded HARQ acknowledgment message from a UE. For example, the base station may receive the encoded HARQ message transmitted at step 2108 of FIG. 19. The encoded HARQ ACK/NACK message may be received by the base station in response to the base station transmitting a downlink message to the UE. For example, the base station may transmit a downlink message to the UE and may monitor a particular radio resource (e.g., a radio resource which the base station has scheduled the UE for transmitting HARQ acknowledgment feedback) for the encoded HARQ ACK/NACK message to determine whether the UE successfully received the downlink message.

At 2204, the base station may initiate a decoding process on the encoded HARQ acknowledgment message. The decoding process may comprise a polar decoding process that initially decodes frozen bits of the polar code before decoding information bits of the polar code.

At 2206, the base station may determine that a match between a decoded subset of the frozen bits and a reference sequence of bits associated with a negative acknowledgement (NACK) message is above a predetermined threshold. For example, and as described in greater detail above in reference to early termination, the base station may keep a running comparison of the subset of decoded frozen bits to a corresponding sequence of reference bits that should be obtained if the HARQ ACK/NACK message is a NACK message. If the decoded subset of frozen bits and the reference sequence of bits match to a degree that exceeds a predetermined threshold, the base station may determine that the encoded HARQ ACK/NACK message is a NACK message. Advantageously, because the base station has previously scheduled the UE to transmit the encoded HARQ ACK/NACK message in a particular radio resource, the base station may not need to decode a UE identifier from the encoded HARQ ACK/NACK message in addition to determining whether the encoded HARQ ACK/NACK message is an ACK or a NACK message, and a single determination may be made by the base station to conclude whether the encoded HARQ ACK/NACK message is an ACK or a NACK message.

In some embodiments, the base station may complete decoding all of the frozen bits, without determining that the encoded HARQ ACK/NACK message is a NACK or an ACK message. In these embodiments, the ACK/NACK bits may be additionally encoded in information bits of the polar code, and the base station may continue to decode the information bits to identify whether the encoded HARQ ACK/NACK message is an ACK or a NACK message.

At 2208, the base station may schedule an early retransmission of the downlink message to the UE based on the determination that the match between the sequence of frozen bits and the reference sequence of bits associated with the NACK message is above the predetermined threshold. In other words, if the base station determines that the encoded HARQ ACK/NACK message is a NACK message, the base station may schedule an early retransmission of the downlink message. For example, the base station may schedule an early retransmission of the downlink message with the UE, wherein the base station may schedule the early transmission earlier than would be possible if the entire HARQ ACK/NACK message was decoded prior to scheduling the early retransmission. The base station may then retransmit the downlink message according to the retransmission schedule, and the UE may receive the retransmitted downlink message.

In some embodiments, if it is determined that the encoded HARQ ACK/NACK message is an ACK message (or that it is not a NACK message), the base station may terminate the method and may not retransmit the downlink message.

Because the base station decodes the frozen bits before it decodes the information bits, encoding the NACK message in the frozen bits may enable the base station to determine that a retransmission is necessary earlier than if the NACK message was encoded only in the information bits. The UE may thereby receive the retransmission earlier, improving the user experience in wireless applications that are sensitive to latency (e.g., URLLC applications).

CONCLUSIONS

Embodiments herein describe a method of frozen bit assignment integral to the polar code construction to facilitate early block discrimination on DCI blind detection. The proposal leverages a property unique to polar codes that permits use of frozen bit contents to convey user ID. The structure is further leveraged to provide cell separation in a manner that meets the objectives set for LTE. The end result is a scrambling sequence that enables both CELL_ID and UE_ID with the added benefit of early termination. Replicated at the decoder, this imprinting is useful in discerning blocks intended for a particular receiver amid multiple candidate PDCCHs, most of which are destined by design for some other user.

The reliability of block determination, including the decision to abandon decoding, improves as a function of bit position in accordance with the underlying channel reliability. The approach is compatible with PC, CRC or hybrid methods of code construction still under consideration. The proposed method of embedding UE_ID imposes minimal changes in presumed encoder and decoder implementations. It further provides wide latitude in algorithm design, permitting receiver manufacturers to trade power savings for reliability of early termination.

Early block discrimination has measurable impact in reducing energy consumption at the UE on blind DCI detection. Inserting a representation of the UE_ID in the frozen bit-field provides an effective means for a receiver to discriminate early in the course of block decoding encodings meant for the present user from those intended for another user. This disclosure describes a discrimination mask intended to serve multiple purposes: early block discrimination based on a UE_ID embedded in the frozen bit contents, adjacent cell interference mitigation based on information bit scrambling, and final verification of user ID based on CRC scrambling. Embodiments described herein elaborate on metrics proposed for early termination. Uses of UE_ID insertion in frozen bits are described beyond that proposed previously to facilitate DCI blind detection.

The following numbered paragraphs describe additional embodiments.

1. A method comprising:
by a base station that is configured to transmit user equipment (UE) specific control information:
generating a first pseudorandom sequence based on a first identifier of the base station;
modulating a plurality of information bits with the first pseudorandom sequence to produce a plurality of modulated information bits;
encoding, using a polar code, the plurality of modulated information bits and a plurality of frozen bits to produce encoded modulated control information, wherein the encoded modulated control information comprises UE-specific control information, wherein the plurality of frozen bits is not modulated with the first pseudorandom sequence; and
wirelessly transmitting the encoded modulated control information.

2. The method of claim 1, the method further comprising:
appending the plurality of information bits with a cyclic redundancy check (CRC) modulated by a CRC mask prior to modulating the plurality of information bits.

3. The method of claim 2, the method further comprising:
generating the CRC mask based on a second pseudorandom sequence generated based on a UE-specific identifier.

4. The method of claim 1, the method further comprising:
modulating the plurality of frozen bits with a second pseudorandom sequence that is generated based on a UE-specific identifier.

5. A method comprising:
by a base station that is configured to transmit user equipment (UE) specific control information:
generating a first pseudorandom sequence based on a first UE-specific identifier;
modulating a plurality of frozen bits with the first pseudorandom sequence to produce a plurality of modulated frozen bits;
encoding, using a polar code, the plurality of modulated frozen bits and a plurality of information bits to obtain encoded modulated control information, wherein the encoded modulated control information comprises UE-specific control information, wherein the plurality of information bits is not modulated with the first pseudorandom sequence; and
wirelessly transmitting the encoded modulated control information.

6. The method of claim 5, the method further comprising:
modulating the plurality of information bits with a second pseudorandom sequence that is generated based on an identifier of the base station.

7. A method for decoding control information, comprising:
by a user equipment device (UE):
receiving polar coded data in a wireless manner from a base station, wherein the polar coded data is encoded from a plurality of frozen bits and a plurality of information bits;
initiating a decoding procedure on the polar coded data to decode the plurality of frozen bits;
after a subset of the plurality of frozen bits has been decoded, performing a cross-correlation calculation between the subset of decoded frozen bits and a corresponding subset of reference frozen bits known to the UE;
aborting the decoding procedure based on a determination that the result of the cross-correlation calculation is below a cross-correlation threshold.

8. The method of claim 7, wherein the reference frozen bits are modulated based on a pseudorandom sequence that is generated based on an identifier of the UE.

9. The method of claim 7, the method further comprising:
demodulating the plurality of information bits using a pseudorandom sequence that is based on an identifier of the base station; and
performing a cyclic redundancy check (CRC) on a subset of the plurality of demodulated information bits.

10. A method for decoding control information, comprising:
by a user equipment device (UE):
receiving polar coded data in a wireless manner from a base station, wherein the polar coded data is encoded from a plurality of frozen bits and a plurality of information bits;
performing a demodulation of the polar coded data using a demodulation matrix, wherein the demodulation matrix is derived from each of a first pseudorandom sequence based on an identifier of the UE, and a second pseudorandom sequence based on an identifier of the base station;
initiating a decoding procedure on the polar coded data to decode the plurality of frozen bits;
after a subset of the plurality of frozen bits has been decoded, performing a cross-correlation calculation between the subset of decoded frozen bits and a corresponding subset of reference frozen bits known to the UE; and
aborting the decoding procedure based on a determination that the result of the cross-correlation calculation is below a cross-correlation threshold.

11. The method of claim 10, the method further comprising:
performing a cyclic redundancy check (CRC) on the information bits.

12. A method comprising:
by a transmitter:
generating a plurality of pseudorandom sequences based on a plurality of respective identifiers;
modulating each of a plurality of subsets of a sequence of bits with respective ones of the plurality of pseudorandom sequences;
encoding the modulated sequence of bits to produce an encoded message; and
wirelessly transmitting the encoded message.

13. The method of claim 12, wherein the plurality of subsets of the sequence of bits comprise frozen bits and information bits of a polar code.

14. The method of claim 13, wherein the plurality of subsets of the sequence of bits further comprises cyclic redundancy check (CRC) bits.

15. The method of claim 12, wherein the plurality of identifiers comprise a user equipment (UE) identifier and a base station identifier.

16. The method of claim 12, wherein the plurality of subsets of the sequence of bits are contiguous.

17. The method of claim 12, wherein the plurality of subsets of the sequence of bits are non-contiguous.

18. The method of claim 12, wherein the plurality of subsets of the sequence of bits partially overlap.

19. A method for decoding a message, the method comprising:
by a receiver:
receiving, in a wireless manner, an encoded message, wherein the encoded message is encoded from an unencoded message comprising a sequence of bits;
generating a first pseudorandom sequence based on a first identifier stored on the receiver;
initiating a decoding process on the encoded message to decode a first subset of the sequence of bits;
demodulating the first subset of the sequence of bits using the first pseudorandom sequence;
performing a cross-correlation calculation between the decoded first subset of the demodulated sequence of bits and a corresponding subset of a reference sequence of bits; and
abandoning the decoding process based on the results of the cross-correlation calculation falling below a correlation threshold.

20. The method of claim 19, wherein the sequence of bits comprises frozen bits and information bits of a polar code, and wherein the decoding process is initially performed on a subset of the frozen bits.

21. The method of claim 20, wherein the sequence of bits further comprises cyclic redundancy check (CRC) bits.

22. The method of claim 19, wherein the identifier is a user equipment (UE) identifier.

23. The method of claim 19, the method further comprising:
generating a second pseudorandom sequence based on a second identifier stored on the receiver;
decoding a second subset of the sequence of bits; and
demodulating the second subset of the sequence of bits using the second pseudorandom sequence.

24. The method of claim 23, wherein the second identifier is an identifier of the transmitter.

25. The method of claim 23, the method further comprising,
after decoding the second subset of the sequence of bits, performing a cyclic redundancy check (CRC) on the decoded message.

26. The method of any of the previous claims, wherein at least one of the first or second pseudorandom sequences is initialized based on a rolling security code.

27. The method of any of the previous claims, wherein a first identifier used to decode the frozen bits is generic to a plurality of downlink control information (DCI) formats; and
wherein a second identifier used to descramble the CRC mask is specific to a particular DCI format.

Multi/Group/Broadcast Identifiers

1. A method comprising:
by a base station that is configured to encode and transmit control information, wherein the control information comprises frozen bits and information bits:
generating a first pseudorandom sequence based on a user equipment (UE) group identifier;
modulating at least a subset of the frozen bits with the first pseudorandom sequence to produce a plurality of modulated frozen bits;
generating a second pseudorandom sequence based on a UE-specific identifier;
modulating at least a subset of the information bits with the second pseudorandom sequence to produce a plurality of modulated information bits;
encoding, using a polar code, at least the plurality of modulated frozen bits and the plurality of modulated information bits to obtain encoded modulated control information, wherein the encoded modulated control information comprises UE-specific control information; and
wirelessly transmitting the encoded modulated control information.

2. The method of claim 1,
wherein the encoded modulated control information is decodable by a UE corresponding to the UE-specific identifier.

3. The method of claim 1,
wherein the at least a subset of the information bits comprises a plurality of cyclic redundancy check (CRC) bits, and wherein modulating the at least a subset of the information bits with the second pseudorandom sequence to produce the plurality of modulated information bits comprises performing a CRC mask on the control information.

4. The method of claim 3,
wherein performing the CRC mask comprises implementing a rolling security code, wherein the rolling security code is initialized based on the UE-specific identifier, and wherein the second pseudorandom sequence is periodically updated based on the rolling security code.

5. The method of claim 1,
wherein the UE group identifier is a generic identifier of one or more UEs being serviced by the base station; and
wherein the UE-specific identifier is specific to a particular UE.

6. The method of claim 1,
wherein the UE group identifier is a broadcast radio network temporary identifier (RNTI) that is useable by a UE in communication with the base station to demodulate the plurality of frozen bits.

7. The method of claim 1,
wherein the UE group identifier is a group radio network temporary identifier (RTNI) that is useable by a group of at least one UE in communication with the base station to demodulate the plurality of frozen bits.

8. The method of claim 1,
wherein the first pseudorandom sequence and one or more additional pseudorandom sequences generated based on one or more additional respective identifiers are configured to be demodulated using a single demodulation process.

9. The method of claim 1,
wherein said encoding at least the plurality of modulated frozen bits and the plurality of modulated information bits to obtain the encoded modulated control information further comprises encoding, using the polar code, one or more of an unmodulated subset of the frozen bits and an unmodulated subset of the information bits to obtain the encoded modulated control information.

10. A base station configured to perform any action or combination of actions as substantially described in any of the preceding claims.

11. A user equipment (UE) configured to perform any action or combination of actions as substantially described in any of the preceding claims.

12. An apparatus configured for inclusion in the base station of any of the preceding claims.

13. An apparatus configured for inclusion in the UE of any of the preceding claims.

Tiered UE Identification

1. A user equipment (UE), comprising:
   a radio; and
   a processor operably coupled to the radio and configured for performing tiered early termination in a polar decoding process,
   wherein the UE is configured to:
      receive, over a wireless medium, a polar encoded message;
      initiate a decoding process on the polar encoded message to obtain a subset of frozen bits of a decoded message;
      determine a non-binary measure based on an early termination metric, wherein the early termination metric is based on a comparison of the subset of frozen bits to reference bits known to the UE;
      based on a determination that the non-binary measure comprises a soft fail, continue the decoding process to obtain decoded distributed cyclic redundancy check (CRC) bits;
      determine whether the decoded distributed CRC bits are valid; and
      based on a determination that the decoded distributed CRC bits are invalid, terminate the decoding process.

2. The UE of claim 1, wherein the UE is further configured to:
   based on a determination that the decoded distributed CRC bits are valid:
      continue the decoding process to obtain a plurality of information bits of the decoded message; and
      perform a final CRC check to verify that the UE is an intended recipient of the polar encoded message.

3. The UE of claim 1, wherein the UE is further configured to:
   based on a determination that the non-binary measure comprises a strong fail, terminate the decoding process without decoding the distributed CRC bits.

4. The UE of claim 1, wherein the UE is further configured to:
   based on a determination that the non-binary measure comprises a strong pass:
      continue the decoding process to obtain a plurality of information bits of the decoded message; and
      perform a final CRC check on the information bits to verify that the UE is an intended recipient of the polar encoded message,
      wherein the distributed CRC bits are not validated prior to obtaining the plurality of information bits.

5. The UE of claim 1,
wherein the non-binary measure comprises a computed value that may be classified as one of a strong fail, the soft fail, or a strong pass.

6. The UE of claim 1,
wherein the non-binary measure comprises a count of mismatches between the subset of frozen bits and the reference bits.

7. The UE of claim 1,
wherein the early termination metric comprises a ratio of the number of mismatches between the subset of frozen bits and the reference bits to a running count of the number of decoded frozen bits.

8. A method for operating the UE of any of the preceding claims.

9. An apparatus configured for inclusion in the UE of any of the preceding claims.

Embodiments of the present disclosure may be realized in any of various forms. For example, in some embodiments, the present invention may be realized as a computer-implemented method, a computer-readable memory medium, or a computer system. In other embodiments, the present invention may be realized using one or more custom-designed hardware devices such as ASICs. In other embodiments, the present invention may be realized using one or more programmable hardware elements such as FPGAs.

In some embodiments, a non-transitory computer-readable memory medium may be configured so that it stores program instructions and/or data, where the program instructions, if executed by a computer system, cause the computer system to perform a method, e.g., any of the method embodiments described herein, or, any combination of the method embodiments described herein, or, any subset of any of the method embodiments described herein, or, any combination of such subsets.

In some embodiments, a computing device may be configured to include a processor (or a set of processors) and a memory medium, where the memory medium stores program instructions, where the processor is configured to read and execute the program instructions from the memory medium, where the program instructions are executable to implement any of the various method embodiments described herein (or, any combination of the method embodiments described herein, or, any subset of any of the method embodiments described herein, or, any combination of such subsets). The device may be realized in any of various forms.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A user equipment (UE) configured to wirelessly communicate with a base station, the UE comprising:
a radio; and
a processor operably coupled to the radio, wherein the UE is configured to:
determine whether a downlink message was successfully received from the base station;
based on the determination whether the downlink message was successfully received, modulate a plurality of frozen bits of a polar code based on a hybrid automatic repeat request (HARQ) acknowledgment message to produce a plurality of modulated frozen bits;
encode, using a polar code, the plurality of modulated frozen bits and a plurality of information bits to obtain an encoded HARQ acknowledgment message; and
wirelessly transmit the encoded HARQ acknowledgment message to the base station.

2. The UE of claim 1,
wherein said modulating the plurality of frozen bits based on the HARQ acknowledgment message comprises performing spread mapping on the HARQ acknowledgment message to obtain a pseudorandom binary sequence that has the same length as the frozen bits and modulating the plurality of frozen bits with the pseudorandom binary sequence.

3. The UE of claim 2, wherein the UE is further configured to:
combine said performing spread mapping with block coding to modulate the plurality of frozen bits based on multiple acknowledgment/negative acknowledgment (ACK/NACK) bits.

4. The UE of claim 1:
wherein the plurality of information bits comprises a plurality of modulated information bits,
wherein the UE is further configured to modulate the information bits based on the HARQ acknowledgment message in response to the determination whether the downlink message was successfully received.

5. The UE of claim 1,
wherein the encoded HARQ acknowledgment message is wirelessly transmitted in association with an Ultra-Reliable Low-Latency Communications (URLLC) service.

6. The UE of claim 1,
wherein said wirelessly transmitting is performed using a radio resource that has been scheduled by the base station.

7. The UE of claim 1,
wherein, in response to the base station receiving the encoded HARQ acknowledgment message, initiating a decoding process on the encoded HARQ acknowledgment message, determining that a match between a decoded subset of the frozen bits and a reference sequence of bits associated with a negative acknowledgement (NACK) message is above a predetermined threshold, and scheduling an early retransmission of the downlink message to the UE based on the determination that the match between the sequence of frozen bits and the reference sequence of bits associated with the NACK message is above the predetermined threshold, the UE is further configured to:
receive an early retransmission of the downlink message.

8. A method for performing early retransmission of downlink messages, the method comprising:
by a base station:
transmitting a downlink message to a user equipment (UE);
in response to transmitting the downlink message to the UE, receiving a polar encoded hybrid automatic repeat request (HARQ) acknowledgment message from the UE;
initiating a decoding process on the polar encoded HARQ acknowledgment message to obtain a sequence of frozen bits;
determining that a match between the sequence of frozen bits and a reference sequence of bits associated with a negative acknowledgement (NACK) message is above a predetermined threshold; and
scheduling an early retransmission of the downlink message to the UE based on the determination that the match between the sequence of frozen bits and the reference sequence of bits associated with the NACK message is above the predetermined threshold.

9. The method of claim 8, the method further comprising:
performing early termination of the decoding process based on the determination that the match between the sequence of frozen bits and the reference sequence of bits associated with the NACK message is above the predetermined threshold.

10. The method of claim 8,
wherein the sequence of frozen bits has been modulated by the UE with a pseudorandom binary sequence (PRBS), wherein the PRBS was obtained by performing spread mapping on an unencoded HARQ acknowledgment message, wherein the PRBS is the same length as a total number of frozen bits utilized in the polar code.

11. The method of claim 10,
wherein said performing spread mapping is combined with block coding to modulate and encode multiple ACK/NACK bits.

12. The method of claim 8:
wherein the plurality of information bits comprises a plurality of modulated information bits, wherein the modulated information bits are also modulated with the HARQ acknowledgment message in response to receiving the downlink message.

13. The method of claim 8,
wherein the polar encoded HARQ acknowledgment message is transmitted as part of an Ultra-Reliable Low-Latency Communications (URLLC) service.

14. The method of claim 8, the method further comprising:
prior to receiving the polar encoded HARQ acknowledgment message from the UE, scheduling a radio resource for the UE to transmit the polar encoded HARQ acknowledgment message, wherein the polar encoded message is received by the base station through the scheduled radio resource.

15. A base station configured for performing early retransmission of downlink messages, the base station comprising:
a radio;
a processor coupled to the radio, wherein the base station is configured to:
transmit a downlink message to a user equipment (UE);
in response to transmitting the downlink message to the UE, receive a polar encoded hybrid automatic repeat request (HARQ) acknowledgment message from the UE;

initiate a decoding process on the polar encoded HARQ acknowledgment message to obtain a sequence of frozen bits;

determine that a match between the sequence of frozen bits and a reference sequence of bits associated with a negative acknowledgement (NACK) message is above a predetermined threshold; and schedule an early retransmission of the downlink message to the UE based on the determination that the match between the sequence of frozen bits and the reference sequence of bits associated with the NACK message is above the predetermined threshold.

16. The base station of claim 15, wherein the base station is further configured to:

perform early termination of the decoding process based on the determination that the match between the sequence of frozen bits and the reference sequence of bits associated with the NACK message is above the predetermined threshold.

17. The base station of claim 15, wherein the sequence of frozen bits has been modulated by the UE with a pseudorandom binary sequence (PRBS), wherein the PRBS was obtained by performing spread mapping on an unencoded HARQ acknowledgment message, wherein the PRBS is the same length as a total number of frozen bits utilized in the polar code.

18. The base station of claim 17, wherein said performing spread mapping is combined with block coding to modulate and encode multiple acknowledgment/negative acknowledgment (ACK/NACK) bits.

19. The base station of claim 15, wherein the plurality of information bits comprises a plurality of modulated information bits, wherein the modulated information bits are also modulated with the HARQ acknowledgment message in response to receiving the downlink message.

20. The base station of claim 15, wherein the base station is further configured to:

prior to receiving the polar encoded HARQ acknowledgment message from the UE, schedule a radio resource for the UE to transmit the polar encoded HARQ acknowledgment message, wherein the base station is further configured to receive the polar encoded message through the scheduled radio resource.

* * * * *